United States Patent
Matsushima et al.

(10) Patent No.: US 10,563,320 B2
(45) Date of Patent: Feb. 18, 2020

(54) TWO-DIMENSIONAL PEROVSKITE FORMING MATERIAL, STACKED STRUCTURE, ELEMENT, AND TRANSISTOR

(71) Applicant: KYUSHU UNIVERSITY, NATIONAL UNIVERSITY CORPORATION, Fukuoka-shi, Fukuoka (JP)

(72) Inventors: Toshinori Matsushima, Fukuoka (JP); Chuanjiang Qin, Fukuoka (JP); Chihaya Adachi, Fukuoka (JP)

(73) Assignee: KYUSHU UNIVERSITY, NATIONAL UNIVERSITY CORPORATION, Fukuoka (JP)

( * ) Notice: Subject to any disclaimer, the term of this patent is extended or adjusted under 35 U.S.C. 154(b) by 0 days.

(21) Appl. No.: 15/776,530

(22) PCT Filed: Nov. 16, 2016

(86) PCT No.: PCT/JP2016/083932
§ 371 (c)(1),
(2) Date: May 16, 2018

(87) PCT Pub. No.: WO2017/086337
PCT Pub. Date: May 26, 2017

(65) Prior Publication Data
US 2018/0337357 A1 Nov. 22, 2018

(30) Foreign Application Priority Data

Nov. 17, 2015 (JP) .................................. 2015-224923
Mar. 29, 2016 (JP) .................................. 2016-065085

(51) Int. Cl.
*C30B 7/00* (2006.01)
*H01L 51/05* (2006.01)
(Continued)

(52) U.S. Cl.
CPC ................ *C30B 7/005* (2013.01); *C30B 7/00* (2013.01); *C30B 29/52* (2013.01); *C30B 29/54* (2013.01);
(Continued)

(58) Field of Classification Search
None
See application file for complete search history.

(56) References Cited

U.S. PATENT DOCUMENTS 9,391,287 B1 * 7/2016 Huang ................ H01L 51/4213
2002/0124790 A1 * 9/2002 Era .......................... C30B 7/00
117/1

(Continued)

FOREIGN PATENT DOCUMENTS

| JP | 2000260999 A | 9/2000 |
| JP | 2001323387 A | 11/2001 |
| JP | 2002110999 A | 4/2002 |

OTHER PUBLICATIONS

Geng, Wei, et al. "Effect of Surface Composition on Electronic Properties of Methylammonium Lead Iodide Perovskite." Journal of Materiomics, vol. 1, No. 3, 2015, pp. 213-220., doi:10.1016/j.jmat.2015.07.005. (Year: 2015).*

(Continued)

*Primary Examiner* — J. E. Schoenholtz
(74) *Attorney, Agent, or Firm* — Browdy and Neimark, P.L.L.C.

(57) ABSTRACT

A two-dimensional perovskite forming material with an ammonium halide group disposed on its surface can achieve a high carrier mobility. Preferably, the two-dimensional perovskite forming material includes a monolayer that has such an ammonium halide group at a terminal of its molecu- (Continued)

lar structure, and the ammonium halide group in the monolayer is disposed in an ordered fashion on the surface of the material.

44 Claims, 20 Drawing Sheets

(51) Int. Cl.
  *H01L 51/00* (2006.01)
  *C30B 29/52* (2006.01)
  *C30B 29/54* (2006.01)
(52) U.S. Cl.
  CPC ...... *H01L 51/0003* (2013.01); *H01L 51/0077* (2013.01); *H01L 51/055* (2013.01); *H01L 51/0525* (2013.01); *H01L 51/0541* (2013.01); *H01L 51/0545* (2013.01); *H01L 51/0562* (2013.01); *H01L 2251/303* (2013.01)

(56) References Cited

U.S. PATENT DOCUMENTS

| | | | | |
|---|---|---|---|---|
| 2016/0222039 | A1* | 8/2016 | Sum | C07F 7/003 |
| 2017/0162811 | A1* | 6/2017 | Li | H01L 51/4226 |
| 2018/0286596 | A1* | 10/2018 | Snaith | H01L 51/0023 |

OTHER PUBLICATIONS

Zhou, Di, et al. "Perovskite-Based Solar Cells: Materials, Methods, and Future Perspectives." Journal of Nanonnaterials, vol. 2018, 2018, pp. 1-15., doi:10.1155/2018/8148072. (Year: 2018).*

Xu, Xiaofen, et al. "Surface Chemical Study on the Covalent Attachment of Hydroxypropyltrimethyl Ammonium Chloride Chitosan to Titanium Surface." Applied Surface Science, vol. 257, No. 24, 2011, pp. 10520-10528., doi:10.1016/j.apsusc.2011.07.033. (Year: 2011).*

Definition of 'ordered' downloaded from URL<https://www.merriam-webster.com/dictionary/ordered> on Aug. 26, 2019. (Year: 2019).*

Japanese and English versions of the International Preliminary Report on Patentability (Chapter I of the Patent Cooperation Treaty) (PCT Rule 44bis) for PCT/JP2016/083932 dated Feb. 21, 2017.

International Search Report and Written Opinion for PCT/JP2016/083932 dated dated Feb. 21, 2017.

Yixin Zhao et al., "Effective hole extraction using MoOxAl contact in perovskite CH3NH3PbI3 solar cells", Applied Physics Letters, May 30, 2014, vol. 104, p. 213906-1-213906-4.

Toshinori Matsushima et al., "High-carrier-mobility field-effect transistors based on organk-1norgcmic perovskite semiconductors", Proceedings of the 2016 IEICE General Conference Electronics 2, Mar. 15, 2016, pp. SS-43 to SS44 with partial English translation.

Jin Hyuck Heo et al., "Efficient inorganic-organic hybrid heterojunction solar cells containing perovskite compound and polymeric hole conductors", Nat. Photon. 7, 486 (2013).

Xin Yu Chin et al., "Lead iodide perovskite light-emitting field-effect transistor", Nat. Commun. 6, 7383 (2015).

C. R. Kagan et al, "Organic-Inorganic Hybrid Materials as Semiconducting Channels in Thin-Film Field-Effect Transistors", Science 286, 945 (1999).

David B. Mitzi et al., "Structurally Tailored Organic-Inorganic Perovskites:Optical Properties and Solution-Processed Channel Materials for Thin-Film Transistors", Chem. Mater. 13, 3728 (2001).

C. R. Kagan et al., "Patterning organic-inorganic thin-film transistors using microcontact printed templates", Appl. Phys. Lett. 79, 3535 (2001).

David B. Mitzi et al., "Hybrid Field-Effect Transistor Based on a Low-Temperature Melt-Processed Channel Layer", Adv. Mater. 14, 1772 (2002).

Toshinori Matsushima et al., "High Field-Effect Hole Mobility in Organic-Inorganic Hybrid Thin Films Prepared by Vacuum Vapor Deposition Technique", Japan J. Appl. Phys. 43, L1199 (2004).

Gongming Wang et al., "Wafer-scale growth of large arrays of perovskite microplate crystals for functional electronics and optoelectronics", Sci. Adv. 2015;1:e1500613.

* cited by examiner (a)

(b)

(a)

(b)

(a)

(b)

(a)

(b)

(a)

(b)

TWO-DIMENSIONAL PEROVSKITE FORMING MATERIAL, STACKED STRUCTURE, ELEMENT, AND TRANSISTOR

TECHNICAL FIELD

The present invention relates to a two-dimensional perovskite forming material, and a stacked structure, element, and transistor using the same.

BACKGROUND ART

Recently, organic-inorganic perovskite is attracting attention as a semiconductor material for various elements. Organic-inorganic perovskite is an ionic compound composed of an organic cation, a divalent metal ion such as $Sn^{2+}$ or $Pb^{2+}$, and a halogen ion. In a known three-dimensional perovskite, these ions assemble into the same crystal structure (perovskite-type structure) as perovskite (calcium titanate mineral). In a known two-dimensional perovskite, inorganic layers each made of two-dimensionally disposed inorganic frameworks, each corresponding to the octahedral portion in a perovskite-type structure, and organic layers, each made of oriented organic cations, are alternately stacked to form a layered structure. Because organic-inorganic perovskite comprises an organic structure, it can be both flexibilized and formed into a layer by solution deposition, which is advantageous in reducing the production cost of various elements. Also, because organic-inorganic perovskite has an inorganic framework and thus is expected to provide a high carrier mobility by virtue of band transport, it is extensively studied to enhance its carrier mobility.

For example, Non-Patent Literature 1 describes a field-effect hole mobility of $10^{-5}$ $cm^2/Vs$ achieved in a three-dimensional perovskite represented by $CH_3NH_3PbI_3$ at room temperature. Also, Non-Patent Literature 2 describes a field-effect electron mobility of 0.1 $cm^2/Vs$ and a field-effect hole mobility of 0.01 $cm^2/Vs$ achieved in a three-dimensional perovskite of the same composition at 78 K.

On the other hand, Non-Patent Literatures 3 to 6 describe a field-effect hole mobility of 0.5 to 2.6 $cm^2/Vs$ achieved in a two-dimensional perovskite represented by $(C_6H_5C_2H_4NH_3)_2SnI_4$ at room temperature.

Also, Non-Patent Literature 7 attempted to, instead of forming a two-dimensional perovskite directly on the surface of an insulator layer, to form it on an OTS (octadecyltrichlorosilane) monolayer that has been formed on the insulator layer. The same document describes a field-effect hole mobility of 0.78 $cm^2/Vs$ achieved by such a layer configuration at room temperature. Also, in Non-Patent Literature 8, an OTS monolayer was formed on the surface of an insulator layer, a part of the OTS monolayer was selectively oxygen-plasma treated to form a hydrophilic region, and a three-dimensional perovskite was formed on this hydrophilic region. The same document describes an electron mobility of 2.5 $cm^2/Vs$ at 77 K achieved in the three-dimensional perovskite thus formed.

PRIOR ART DOCUMENTS

Non-Patent Literatures

Non-Patent Literature 1: Nat. Photon. 7, 486 (2013)
Non-Patent Literature 2: Nat. Commun. 6, 7383 (2015)
Non-Patent Literature 3: Science 286, 945 (1999)
Non-Patent Literature 4: Chem. Mater. 13, 3728 (2001)
Non-Patent Literature 5: Appl. Phys. Lett. 79, 3535 (2001)
Non-Patent Literature 6: Adv. Mater. 14, 1772 (2002)
Non-Patent Literature 7: Jpn. J. Appl. Phys. 43, L1199 (2004)
Non-Patent Literature 8: Sci. Adv. 2015; 1:e1500613

SUMMARY OF THE INVENTION

Problems to be Solved by the Invention

As described above, a number of reported studies have focused on the carrier mobility of organic-inorganic perovskite. However, the carrier mobility is only 0.5 to 2.6 $cm^2/Vs$ (hole) in two-dimensional perovskite, and only an even lower carrier mobility has been achieved in three-dimensional perovskite. Non-Patent Literatures 7 and 8 also tested an idea of introducing an OTS monolayer or an oxygen-plasma treated layer thereof between an insulator layer and an organic-inorganic perovskite, but still failed to realize a high mobility. Consequently, organic-inorganic perovskite has not been successfully put into practical application despite its potentially useful characteristics as a semiconductor material for elements.

In order to solve such a problem of the conventional art, the present inventors conducted extensive studies to realize a high carrier mobility in two-dimensional perovskite.

Means for Solving the Problems

As a result of the extensive studies, the present inventors have found that a two-dimensional perovskite that has a more ordered disposition of inorganic frameworks and organic cations with fewer defects can be obtained by forming the two-dimensional perovskite on a surface with an ammonium halide group disposed thereon, compared to a two-dimensional perovskite directly formed on the surface of an insulator layer such as an $SiO_2$ layer. Further, the inventors have found that the two-dimensional perovskite thus formed can have a carrier mobility as high as over 10 $cm^2/Vs$. Having been proposed based on these findings, the present invention has the following specific configuration.
[1] A two-dimensional perovskite forming material, which has a surface with an ammonium halide group disposed thereon.
[2] The two-dimensional perovskite forming material according to [1], wherein the ammonium halide group is represented by —$NH_3X$ (X represents a halogen ion).
[3] The two-dimensional perovskite forming material according to [2], wherein X in the ammonium halide group is an iodide ion.
[4] The two-dimensional perovskite forming material according to any one of [1] to [3], which comprises a monolayer that has an ammonium halide group, wherein the ammonium halide group disposed on the surface is the ammonium halide group in the monolayer.
[5] The two-dimensional perovskite forming material according to any one of [1] to [4], which comprises a molecular structure with a terminal ammonium halide group, wherein the ammonium halide group disposed on the surface is the terminal ammonium halide group in the molecular structure.
[6] The two-dimensional perovskite forming material according to [5], wherein the molecular structure has a structure in which one terminal is the ammonium halide group, and the other terminal is a different functional group, and the ammonium halide group and the different functional group are joined by a linker.

[7] The two-dimensional perovskite forming material according to [6], wherein the linking chain length of the linker is 2 to 10 atoms.
[8] The two-dimensional perovskite forming material according to [6] or [7], wherein the linker joining the ammonium halide group and the a different functional group is an alkylene group, an alkyleneoxy group, an arylene group, an aryleneoxy group, an alkenylene group, or an alkynylene group, or a linker formed by joining two or more selected from these groups.
[9] The two-dimensional perovskite forming material according to any one of [6] to [8], wherein the linker has a linear molecular structure.
[10] The two-dimensional perovskite forming material according to any one of [6] to [9], wherein the different functional group in the molecular structure is: a hydroxyl group, a thiol group, a carboxyl group, an alkoxysilyl group, or a halosilyl group, or a linker formed by a reaction between one of these groups and another functional group in a different molecular structure than the molecular structure.
[11] The two-dimensional perovskite forming material according to [10], wherein the functional group is a hydroxyl group or a carboxyl group.
[12] The two-dimensional perovskite forming material according to [10], wherein the functional group is an oxy group (—O—) formed by a reaction between hydroxyl groups.
[13] The two-dimensional perovskite forming material according to [10], wherein the functional group is an ester group (—COO—) formed by a reaction between a hydroxyl group and a carboxyl group.
[14] The two-dimensional perovskite forming material according to any one of [5] to [13], wherein the molecular structure is a molecular structure represented by the general formula (1) below.

$$(\text{—O—})_3\text{Si}(\text{CH}_2)_n\text{NH}_3\text{I} \quad (1)$$

[in the general formula (1), n is an integer from 1 to 20.]
[15] The two-dimensional perovskite forming material according to any one of [5] to
[14], which further has a support and has the molecular structure on the support.
[16] The two-dimensional perovskite forming material according to [15], wherein the support has a functional group on the surface on the side toward the molecular structure.
[17] The two-dimensional perovskite forming material according to [15] or [16], wherein the molecular structure is joined to the support.
[18] The two-dimensional perovskite forming material according to any one of [15] to
[17], wherein the support has a stacked structure of a gate electrode and an insulator, and has the molecular structure on the insulator on an opposite side to the gate electrode.
[19] The two-dimensional perovskite forming material according to [18], wherein the gate electrode is formed from silicon (Si) as its major constituent, and the insulator is formed from silicon dioxide ($SiO_2$) as its major constituent.
[20] The two-dimensional perovskite forming material according to any one of [15] to [17], wherein the support is a source electrode or a drain electrode.
[21] A stacked structure, comprising a layer with an ammonium halide group disposed on its surface and a two-dimensional perovskite layer.
[22] The stacked structure according to [21], wherein the layer with an ammonium halide group disposed on its surface is formed from the two-dimensional perovskite forming material according to any one of [1] to [20].
[23] The stacked structure according to [21] or [22], wherein the two-dimensional perovskite layer comprises Sn or Pb.
[24] The stacked structure according to any one of [21] to [23], wherein the two-dimensional perovskite layer comprises an alkylene group-containing compound.
[25] The stacked structure according to any one of [21] to [24], wherein the two-dimensional perovskite layer comprises an aromatic ring-containing compound.
[26] The stacked structure according to any one of [21] to [25], wherein the two-dimensional perovskite layer comprises a compound that has an alkylene group joined to an aromatic ring in its structure.
[27] The stacked structure according to [21] or [22], wherein the two-dimensional perovskite layer comprises a perovskite-type compound represented by any one of the general formulas (2) to (4) below.

$$A_2BX_4 \quad (2)$$

[In the general formula (2), A represents an organic cation, B represents a divalent metal ion, and X represents a halogen ion. The two instances of A, or the four instances of X, may be the same as each other or not.]

$$A^2{}_2A^1{}_{n-1}B_nX_{3n+1} \quad (3)$$

[In the general formula (3), $A^1$ represents an organic cation, $A^2$ represents an organic cation with a carbon number greater than that of $A^1$, B represents a divalent metal ion, X represents a halogen ion, and n represents an integer from 1 to 100. The two instances of $A^2$, or the plural instances of X, may be the same as each other or not. When n is 3 or more, the plural instances of $A^1$ may be the same as each other or not.]

$$A^2{}_2A^1{}_mB_mX_{3m+2} \quad (4)$$

[In the general formula (4), $A^1$ represents an organic cation, $A^2$ represents an organic cation with a carbon number greater than that of $A^1$, B represents a divalent metal ion, X represents a halogen ion, and m represents an integer from 1 to 100. The two instances of $A^2$, or the plural instances of X, may be the same as each other or not. When m is 2 or more, the plural instances of $A^1$ may be the same as each other or not.]
[28] The stacked structure according to [27], wherein A in the general formula (2) is an ammonium represented by the general formula (5) below, $A^1$ in the general formula (3) is an ammonium represented by the general formula (6) below, $A^2$ in the general formula (3) is an ammonium represented by the general formula (5) below, $A^1$ the general formula (4) is an ammonium represented by the general formula (6) below, and $A^2$ in the general formula (4) is an ammonium represented by the general formula (7) below.

$$R_4N^+ \quad (5)$$

[In the general formula (5), R represents a hydrogen atom or a substituent, and at least one of the four instances of R is a substituent with a carbon number of 2 or more.]

$$R^{11}{}_4N^+ \quad (6)$$

[In the general formula (6), $R^{11}$ represents a hydrogen atom or a substituent, and at least one of the four instances of R is a substituent.]

$$(R^{12}{}_2C=NR^{13}{}_2)^+ \quad (7)$$

[In the general formula (7), $R^{12}$ and $R^{13}$ each independently represent a hydrogen atom or a substituent.]

[29] The stacked structure according to [28], wherein the ammonium represented by the general formula (5) is an ammonium represented by the general formula (5a) below.

$$Ar(CH_2)_{n1}NH_3^+ \qquad (5a)$$

[In general formula (5a), Ar represents an aromatic ring. n1 is an integer from 1 to 20.]

[30] The stacked structure according to [29], wherein Ar in the general formula (5a) is a benzene ring, or a fused polycyclic hydrocarbon that has a structure with more than one benzene ring fused.

[31] The stacked structure according to any one of [27] to [30], wherein B in the general formulas (2) to (4) is $Sn^{2+}$ or $Pb^{2+}$.

[32] The stacked structure according to any one of [27] to [31], wherein X in the general formulas (2) to (4) is an iodide ion.

[33] The stacked structure according to any one of [21] to [32], wherein the two-dimensional perovskite layer has a thickness of 50 nm or less.

[34] A method to produce a two-dimensional perovskite, which forms a two-dimensional perovskite layer on a layer with an ammonium halide group disposed on its surface.

[35] The method to produce a two-dimensional perovskite according to [34], wherein the layer with an ammonium halide group disposed on its surface is formed from the two-dimensional perovskite forming material according to any one of [1] to [20].

[36] The method to produce a two-dimensional perovskite according to [34] or [35], wherein the layer with an ammonium halide group disposed on its surface is a layer formed by spin-coating a support with a compound that has an ammonium halide group.

[37] The method to produce a two-dimensional perovskite according to any one of [34] to [36], wherein the layer with an ammonium halide group disposed on its surface is a self-assembled monolayer formed using a molecule with a terminal ammonium halide group.

[38] The method to produce a two-dimensional perovskite according to any one of [34] to [37], wherein the layer with an ammonium halide group disposed on its surface is formed by: conducting a process to form a self-assembled monolayer that has an amino group and then convert the amino group to the ammonium halide.

[39] The method to produce a two-dimensional perovskite according to any one of [34] to [38], wherein the two-dimensional perovskite layer is formed by solution deposition.

[40] An element comprising the stacked structure according to any one of [21] to [33].

[41] A transistor comprising the stacked structure according to any one of [21] to [33].

[42] The transistor according to [41], wherein the stacked structure has a stacked structure of a gate electrode and an insulator, and the ammonium halide group is disposed on the surface of the insulator on an opposite side to the gate electrode.

[43] The transistor according to [41] or [42], which is a top-contact transistor.

[44] The transistor according to [41], which is a top-contact/top-gate transistor.

[45] The transistor according to any one of [41] to [44], which has a transition metal oxide layer between the two-dimensional perovskite layer and at least one of the source electrode and the drain electrode.

[46] The transistor according to [45], wherein the transition metal oxide layer is a molybdenum oxide layer, a rhenium oxide layer, or a tungsten oxide layer.

[47] The transistor according to [46], wherein the metal oxide layer is a molybdenum oxide layer.

Advantageous Effects of the Invention

The two-dimensional perovskite forming material according to the present invention, by virtue of its surface with an ammonium halide group disposed thereon, allows a two-dimensional perovskite layer with fewer defects to be formed on its surface, which can provide a high carrier mobility in the two-dimensional perovskite layer.

The stacked structure according to the present invention is composed of a layer with an ammonium halide group disposed on its surface and a two-dimensional perovskite layer, which can suppress defects that will arise during the step of forming the two-dimensional perovskite layer, also providing a high carrier mobility in the two-dimensional perovskite layer.

DETAILED DESCRIPTION OF THE INVENTION

Hereafter, the present invention is described in detail. As provided below, the constituent elements may be described based on representative embodiments and specific examples of the present invention, but the present invention is not limited to such embodiments and specific examples. As used herein, a numerical range expressed using "to" means a range that includes the numerical values before and after "to" as the minimum and maximum values, respectively. As used herein, a "major constituent" refers to a constituent that accounts for the largest portion of the content of something. A hydrogen atom present in a compound molecule used in the present invention is not particularly limited in terms of isotopic species. For example, all hydrogen atoms in a molecule can be $^1$H, or all or part of them can be $^2$H [heavy hydrogen (deuterium) D].

[Two-Dimensional Perovskite Forming Material]

The two-dimensional perovskite forming material according to the present invention is characterized by having a surface with an ammonium halide group disposed thereon.

When a two-dimensional perovskite is formed on the surface with an ammonium halide group disposed thereon, its inorganic frameworks and organic cations can be disposed in an ordered fashion, to form a two-dimensional perovskite with fewer defects. The two-dimensional perovskite thus formed can have a high carrier mobility because of such few defects. Presumably, this is due to the following mechanism.

The two-dimensional perovskite is formed by supplying a perovskite-type compound that has a compositional ratio of halogen ions, metal ions, and organic cations adjusted to form the two-dimensional perovskite, to the surface on which the two-dimensional perovskite layer is to be formed.

Figure 2:
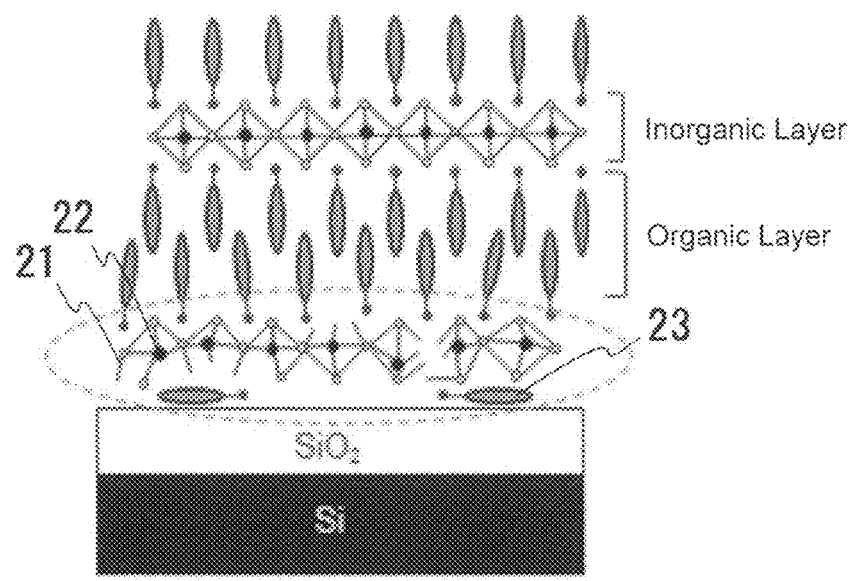
FIG. 2 A schematic sectional view that shows the state of the inorganic frameworks and organic cations disposed in a two-dimensional perovskite directly formed on the surface of an insulator layer.

As shown in FIG. 2, however, if the surface on which the two-dimensional perovskite is to be formed were the surface of a common insulator layer without an ammonium halide group, such as an SiO$_2$ layer, the supply of the perovskite-type compound would not result in a controlled, ordered disposition of halogen ions 21, metal ions 22, and organic cations 23 around the insulator layer surface, and thus would not provide a good two-dimensional perovskite-type structure.

Figure 1:
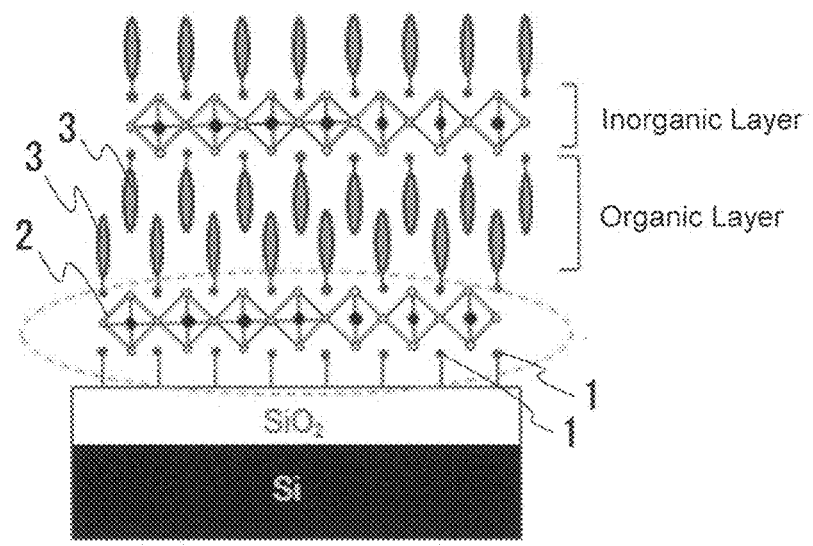
FIG. 1 A schematic sectional view that shows the state of the inorganic frameworks and organic cations disposed in a two-dimensional perovskite formed using a two-dimensional perovskite forming material according to the present invention.

In contrast, as shown in FIG. 1, when the surface on which the two-dimensional perovskite is to be formed has ammonium halide groups 1 disposed thereon, the ammonium halide groups 1 will act analogously to the organic cations that constitute the organic layer in the two-dimensional perovskite, on which the octahedral inorganic frameworks 2 will be disposed in an ordered fashion to form an inorganic layer, on which, further, the organic cations 3 and the inorganic frameworks 2 will be alternately disposed in an ordered fashion to form a two-dimensional perovskite with alternately stacked organic and inorganic layers. That is, the perovskite-type compound will efficiently turn into a two-dimensional perovskite, to form a two-dimensional perovskite with fewer defects and superior crystalline characteristics. The two-dimensional perovskite thus formed will contain very few unreacted constituents and defects, which allows carriers to move more easily, and thus can provide a higher carrier mobility compared to a two-dimensional perovskites formed on a different type of surface.

The ammonium halide group in the two-dimensional perovskite forming material according to the present invention is preferably a group represented by —NH$_3$X (X represents a halogen ion).

The halogen ion represented by X can be a fluoride, chloride, bromide, or iodide ion, and is preferably an iodide ion.

Preferably, the two-dimensional perovskite forming material according to the present invention comprises a monolayer that has an ammonium halide group, wherein the ammonium halide group disposed on its surface is the ammonium halide group in the monolayer. "Monolayer" herein means a layer formed by disposing multiple oriented molecules two-dimensionally. The multiple molecules can be the same as each other or not, and may be cross-linked to each other. Also, the multiple molecules may be attached to the surface of a support by chemisorption, physisorption, electrostatic adsorption, or the like.

Preferably, the two-dimensional perovskite forming material according to the present invention comprises a molecular structure that has a terminal ammonium halide group, and the ammonium halide group disposed on its surface is the terminal ammonium halide group in the molecular structure. The molecular structure that has a terminal ammonium halide group is preferably two-dimensionally disposed with the ammonium halide group oriented outward, and more preferably forms a monolayer. As used herein, "molecular structure" is the structure of a group of multiple atoms in which each atom is bound to at least one of other atoms.

Preferably, the molecular structure that has a terminal ammonium halide group has a structure in which the ammonium halide group is at one terminal and a different functional group is at the other terminal, and that one terminal and the other terminal are joined by a linker. Specific examples of the linker include: alkylene group, an alkyleneoxy group, an arylene group, an aryleneoxy group, alkenylene group, or an alkynylene group, or a linker made by joining two or more selected from these groups or the like. The linking chain length of the linker is not particularly limited, but is preferably 2 to 10 atoms.

The linker preferably has a linear molecular structure, and more preferably has a linear molecular structure along the entire linker. As used herein, "linear molecular structure" means a structure in which the chain length of any side chain is ½ or less of the chain length of the backbone, preferably ¼ or less, wherein the linear molecular structure preferably contains no cyclic structure. The chain length of the backbone is preferably 1 or more atoms, and can be 2 or more atoms, for example. The length of the backbone is preferably 10 atoms or less, more preferably 5 atoms or less, and can be 3 atoms or less, for example. Specific examples of the linear molecular structure include an alkyl chain, exemplified by the structure —(CH$_2$)$_n$—, wherein n is an integer of or more, and, for example, can be 2 or more, and up to 10 or less, preferably 5 or less, and can be 3 or less, for example.

The different functional group joined to the other terminal of the linker can be a hydroxyl group, a thiol group, a carboxyl group, an alkoxysilyl group, a halosilyl group, or the like, preferably a hydroxyl group or a carboxyl group, more preferably a hydroxyl group. Such a functional group may react with a functional group in another molecular structure or with a functional group exposed on the support surface, as described later, to form a linker (hereafter referred to as a "second linker"). This will maintain the relative positions of the molecular structures and those of the molecular structure and the support, and will ensure that the state of the ammonium halide groups disposed on the surface is retained. Specific examples of the second linker include: "—COO—" formed by a reaction between "—COOH" and "—OH", "—O—" formed by a reaction between "—OH" and "—OH", and the like.

A preferred example of such a molecular structure in which one terminal is a halogenated alkyl group and the other terminal is a second linker is a structure represented by the general formula (1) below.

$$(\text{—O—})_3\text{Si}(\text{CH}_2)_n\text{NH}_3\text{I} \qquad (1)$$

In the general formula (1), n is an integer from 1 to 20, preferably an integer from 2 to 10.

The density of the ammonium halide group in the two-dimensional perovskite forming material is not particularly limited, but preferably $10^{10}$ to $10^{16}$/cm$^2$, more preferably $10^{11}$ to $10^{15}$/cm$^2$, further preferably $10^{12}$ to $10^{14}$/cm$^2$. This will make the distance between adjacent ammonium halide groups approximately match the edge length of the cubic crystal system of the perovskite-type structure, making it possible to dispose the octahedral inorganic frameworks in a more ordered fashion on the surface with the ammonium halide group disposed thereon.

The two-dimensional perovskite forming material according to the present invention has a support, and preferably a molecular structure that has the above-described ammonium halide group at its terminal exists on the support.

The support functions to support the molecular structure with an ammonium halide group and the two-dimensional perovskite layer formed thereon, the shape, size, and material of which are not particularly limited. For example, the support may be in the shape of a film, a plate, or a particle.

Examples of the material of the support include: an inorganic material such as silicon (Si), silicon dioxide (SiO$_2$), glass, metal, or gallium arsenide, a resin such as polyethylene terephthalate (PET), polyethylene naphthalate (PEN), polyethersulfone (PES), aromatic polyester (liquid crystal polymer), or polyimide (PI), and the like. The support may have a single-layer configuration or a multi-layer configuration. In the multi-layer configuration, the layers may be formed from the same material or different materials.

Preferably, the support has a functional group on its surface on the side toward the molecular structure. Specifically, the functional group can be one listed above as an example of the different functional group joined to the other terminal of the linker, and is preferably a hydroxyl group or a carboxyl group, more preferably a hydroxyl group. The functional group in the support can be a functional group contained in any constituent material of the support, or may be introduced into the support by surface treatment. For example, if such a material of the support around the surface is silicon dioxide, the surface of the support has a hydroxyl group generated from the oxygen atom in silicon dioxide and a hydrogen atom bound thereto.

Preferably, the molecular structure that has a terminal ammonium halide group is joined to the support, wherein the linker that joins the molecular structure and the support is preferably a second linker formed by a reaction between another functional group at a terminal of the precursor molecule of the molecular structure and a functional group on the support surface on the side toward the molecular structure. By joining the molecular structure to the support, the relative positions of the molecular structure and the support are maintained and the relative positions of the molecular structures are also maintained. This will ensure that the state of the ammonium halide group disposed on the surface is retained.

The two-dimensional perovskite forming material according to the present invention can be applied to various elements that involve two-dimensional perovskite, and the specific configuration of the support can be selected as appropriate depending on the application. For example, when the two-dimensional perovskite forming material is applied to a transistor, the support preferably has a stacked structure of a gate electrode and an insulator, and the molecular structure with the terminal ammonium halide group is disposed on that insulator on an opposite side to the gate electrode. This provides a transistor in which the support of the two-dimensional perovskite forming material functions as a gate electrode and a gate insulator, and the two-dimensional perovskite layer formed on the surface of the two-dimensional perovskite forming material functions as a semiconductor layer.

The materials of the gate electrode and the insulator are not particularly limited, but the major constituent of the gate electrode is preferably silicon (Si), and the major constituent of the insulator is preferably silicon dioxide ($SiO_2$). Such a support can be obtained relatively easily by a versatile process to thermally oxidize a silicon substrate. Also, the surface of the silicon dioxide insulator has a hydroxyl group. Thus, if the molecular structure that has a terminal ammonium halide group has a hydroxyl group at the opposite terminal, that hydroxyl group and the hydroxyl group on the insulator surface can react to form a second linker (—O—). This will ensure that the molecular structure is retained on the support.

When the element to which the two-dimensional perovskite is to be applied is a bottom-contact transistor, the support can be a source or drain electrode. This will provide a transistor in which the support of the two-dimensional perovskite forming material functions as a source or drain electrode, and the two-dimensional perovskite layer formed on the surface of the two-dimensional perovskite forming material functions as a semiconductor layer.

[Stacked Structure]

The stacked structure according to the present invention is now described.

The stacked structure according to the present invention is characterized by being composed of a two-dimensional perovskite layer and a layer with an ammonium halide group disposed on its surface. The two-dimensional perovskite layer has a layered structure in which inorganic layers each made of two-dimensionally disposed inorganic frameworks, each corresponding to the octahedral portion in a perovskite-type structure, and organic layers, each made of oriented organic cations, are alternately stacked. The structure of the inorganic frameworks and the organic cations will be discussed later.

In the stacked structure according to the present invention, a layer with an ammonium halide group disposed on its surface is stacked with such a two-dimensional perovskite layer, which can suppress defects that will arise during the step of forming the two-dimensional perovskite layer, providing a high carrier mobility in its two-dimensional perovskite layer.

Hereafter, the configuration of the stacked structure according to the present invention is described in detail.

(Layer with an Ammonium Halide Group Disposed on its Surface)

The layer with an ammonium halide group disposed on its surface can be a two-dimensional perovskite forming material according to the present invention. For the preferred range and specific examples of its configuration, one can refer to the section [Two-Dimensional Perovskite Forming Material].

(Two-Dimensional Perovskite Layer)

The two-dimensional perovskite layer has a layered structure in which inorganic layers each made of two-dimensionally disposed inorganic frameworks, each corresponding to the octahedral portion in a perovskite-type structure, and organic layers, each made of two-dimensionally disposed, oriented organic cations, are alternately stacked. The inorganic frameworks each have a structure in which a divalent metal ion is positioned at the center of an octahedron formed by corner halogen ions, and adjacent octahedra share a corner. The organic cations are oriented with their cationic groups facing toward the inorganic layer. Eight ammonium halide groups form the corners of a cubic crystal system, and each corner of the octahedron is placed at each face center of the cubic crystal system to form the perovskite-type structure. Such a two-dimensional perovskite layer can provide a high carrier mobility along the plane in which the inorganic frameworks are disposed (a plane perpendicular to the thickness), by band transport in the inorganic layer. Also, the two-dimensional perovskite layer has an organic layer, and thus can be both flexibilized by molecular design of the organic cation and formed by solution deposition. This is advantageous when one seeks to reduce the production cost of an element.

The two-dimensional perovskite layer in the stacked structure according to the present invention preferably contains a perovskite-type compound represented by the general formula (2) below, or, more preferably, is formed from a perovskite-type compound represented by the general formula (2) below as its major constituent.

$$A_2BX_4 \quad (2)$$

In the general formula (2), A represents an organic cation, B represents a divalent metal ion, and X represents a halogen ion. The two instances of A, or the four instances of X, may be the same as each other or not.

The organic cation represented by A is preferably an ammonium represented by the general formula (5) below.

$$R_4N^+ \quad (5)$$

In the general formula (5), R represents a hydrogen atom or a substituent, wherein at least one of the four instances of R is a substituent with a carbon number of 2 or more. Among the four instances of R, the number of substituents with a carbon number of 2 or more is preferably 1 or 2, more preferably 1. Also, in the four instances of R that constitute the ammonium, preferably one of them is a substituent with a carbon number of 2 or more, and the rest are hydrogen atoms. When two or more instances of R are substituents, these substituents may be the same as each other or not. The substituent with a carbon number of 2 or more or any other substituent is not particularly limited, but can be an alkyl group, an aryl group, a heteroaryl group, or the like, wherein such a substituent can be further substituted with an alkyl group, an aryl group, a heteroaryl group, halogen, or the like. The number of carbons in the substituent with a carbon number of 2 or more as an alkyl group is preferably 2 to 30, more preferably 2 to 10, further preferably 2 to 5. In an aryl group, it is preferably 6 to 20, more preferably 6 to 18, further preferably 8 to 10. In a heteroaryl group, it is preferably 5 to 19, more preferably 5 to 17, further preferably 7 to 9. A heteroatom in the heteroaryl group can be a nitrogen atom, an oxygen atom, a sulfur atom, or the like. The thickness of the organic layer will depend on the length of the substituent represented by R (e.g., the chain length of the alkyl group), whereby the characteristics of the functional layer formed from this compound can be controlled.

Preferably, the organic cation represented by A has at least one of an alkylene group and an aromatic ring, preferably both of the alkylene group and the aromatic ring, more preferably a structure formed by joining the alkylene group to the aromatic ring, further preferably an ammonium represented by the general formula (5a) below.

$$Ar(CH_2)_{n1}NH_3^+ \quad (5a)$$

In the general formula (5a), Ar represents an aromatic ring. n1 is an integer from 1 to 20.

The aromatic ring in the organic cation may be an aromatic hydrocarbon or an aromatic heterocycle, and is preferably an aromatic hydrocarbon. A heteroatom in the aromatic heterocycle can be a nitrogen atom, an oxygen atom, a sulfur atom, or the like. The aromatic hydrocarbon is: preferably a benzene ring, or a fused polycyclic hydrocarbon that has a structure with more than one benzene ring fused; preferably a benzene ring, naphthalene ring, phenanthrene ring, anthracene ring, chrysene ring, tetracene ring, or perillene ring, preferably a benzene ring or naphthalene ring; further preferably a benzene ring. The aromatic heterocycle is: preferably a pyridine ring, pyrazine ring, pyrimidine ring, pyridazine ring, pyrrole ring, thiophene ring, furan ring, carbazole ring, or triazine ring; more preferably, a pyridine ring, pyrazine ring, pyrimidine ring, or pyridazine ring; further preferably, a pyridine ring. The aromatic ring in the organic cation may have a substituent such as an alkyl group, an aryl group, or a halogen atom (preferably a fluorine atom), wherein a hydrogen atom in the aromatic ring or in the substituent bound to the aromatic ring may be a heavy hydrogen atom.

In the general formula (5a), n1 is an integer from 1 to 20, preferably an integer from 2 to 10.

Besides an ammonium, the organic cation represented by A can be formamidinium, cesium, or the like.

The divalent metal ion represented by B can be $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Eu^{2+}$, or the like, and is preferably $Sn^{2+}$ or $Pb^{2+}$, more preferably $Sn^{2+}$.

The halogen ion represented by X can be a fluoride, chloride, bromide, or iodide ion. The halogen ions represented by three instances of X may be the same as each other, or may be a combination of 2 or 3 different halogen ions. Preferably, the three instances of X are the same halogen ion. More preferably, the three instances of X are each an iodide ion.

Specific preferred examples of the perovskite-type compound represented by the general formula (2) include: tin-based perovskites such as $[CH_3(CH_2)_{n2}NH_3)]_2SnI_4$ (n2=2 to 17), $(C_4H_9C_2H_4NH_3)_2SnI_4$, $(CH_3(CH_2)_{n3}(CH_3)CHNH_3)_2SnI_4$ [n3=5 to 8], $(C_6H_5C_2H_4NH_3)_2SnI_4$, $(C_{10}H_7CH_2NH_3)_2SnI_4$, and $(C_6H_5C_2H_4NH_3)_2SnBr_4$; and lead-based perovskites such as $[CH_3(CH_2)_{n2}NH_3)]_2PbI_4$ (n2=2 to 17), $(C_4H_9C_2H_4NH_3)_2PbI_4$, $(CH_3(CH_2)_{n3}(CH_3)CHNH_3)_2PbI_4$ [n3=5 to 8], $(C_6H_5C_2H_4NH_3)_2PbI_4$, $(C_{10}H_7CH_2NH_3)_2PbI_4$, and $(C_6H_5C_2H_4NH_3)_2PbBr_4$. However, perovskite-type compounds that may be used in the present invention are not limited to these compounds.

The two-dimensional perovskite layer in the stacked structure according to the present invention preferably comprises a perovskite-type compound represented by the general formula (3) below, or, more preferably, is formed from the perovskite-type compound represented by the general formula (3) below as its major constituent.

$$A^2{}_2A^1{}_{n-1}B_nX_{3n+1} \quad (3)$$

In the general formula (3), $A^2$ represents an organic cation with a carbon number greater than that of $A^1$. In the general formula (3), B and X are as defined for the general formula (2), and $A^2$ in the general formula (3) is as defined for the general formula (2). For the preferred range and specific examples of $A^2$, B, and X in the general formula (3), one can refer to the preferred range and specific examples of A, B, and X in the general formula (2). Here, the two instances of $A^2$, or the plural instances of X, may be the same as each other or not. When plural instances of $A^1$ or B are present, the plural instances of $A^1$ or X may be the same as each other or not.

The organic cation represented by $A^1$ is an organic cation with a carbon number smaller than that of $A^2$, preferably an ammonium represented by the general formula (6) below.

$$R^{11}{}_4N^+ \quad (6)$$

In the general formula (6), $R^{11}$ represents a hydrogen atom or a substituent, and at least one of the four instances of $R_{11}$ is a substituent. The number of substituents among the four instances of $R^{11}$ is preferably one or two, more preferably one. That is, among the four instances of $R^{11}$ that constitute the ammonium, preferably one is a substituent and the rest are hydrogen atoms. When two or more instances of $R^{11}$ are substituents, these substituents may be the same as each other or not. The substituents are not particularly limited, but include an alkyl group and an aryl group (phenyl group, naphthyl group, and the like), wherein each substituent may be further substituted with an alkyl group, an aryl group, or the like. The number of carbons in the substituent as an alkyl group is preferably 2 to 30, more preferably 2 to 20, further preferably 2 to 10. In an aryl group, it is preferably 6 to 30, more preferably 6 to 20, further preferably 6 to 10.

Besides an ammonium, the organic cation represented by $A^1$ or $A^2$ can be formamidinium, cesium, or the like.

The compound represented by the general formula (3) forms a layered structure in which inorganic layers formed from octahedral inorganic frameworks $B_nX_{3n+1}$ and organic layers formed from organic cations $A^2$ are alternately stacked. n corresponds to the number of stacked octahedra per inorganic layer, and is an integer from 1 to 100. When n is 2 or more, organic cations $A^1$ are positioned between the stacked octahedra at the corners of the cubic crystal system.

Specific preferred examples of the organic-inorganic perovskite-type compound represented by the general formula (3) include a compound represented by the general formula (3a) below.

$$(C_4H_9NH_3)_2(CH_3NH_3)_{n-1}Sn_nI_{3n+1} \quad (3a)$$

In the general formula (3a), n is an integer from 1 to 100, preferably an integer from 1 to 5. Specifically, it can be $(C_4H_9NH_3)_2SnI_4$, $(C_4H_9NH_3)_2(CH_3NH_3)Sn_2I_7$, $(C_4H_9NH_3)_2(CH_3NH_3)_2Sn_3I_{10}$, $(C_4H_9NH_3)_2(CH_3NH_3)_3Sn_4I_{13}$, or $(C_4H_9NH_3)_2(CH_3NH_3)_4Sn_5I_{16}$. Also, specific preferred examples of the organic-inorganic perovskite-type compound represented by the general formula (3) include: [CH$_3$(CH$_2$)$_n$NH$_3$)]$_2$PbI$_4$ (n=2 to 17), (C$_4$H$_9$C$_2$H$_4$NH$_3$)$_2$PbI$_4$, (CH$_3$(CH$_2$)$_n$(CH$_3$)CHNH$_3$)$_2$PbI$_4$[n=5 to 8], (C$_6$H$_5$C$_2$H$_4$NH$_3$)$_2$PbI$_4$, (C$_{10}$H$_7$CH$_2$NH$_3$)$_2$PbI$_4$, (C$_6$H$_5$C$_2$H$_4$NH$_3$)$_2$PbBr$_4$, and the like. However, organic-inorganic perovskite-type compounds that may be used in the present invention are not limited to these compounds.

The two-dimensional perovskite layer in the stacked structure according to the present invention preferably contains a perovskite-type compound represented by the general formula (4) below, or, more preferably, is formed from a perovskite-type compound represented by the general formula (4) below as its major constituent.

$$A^2{}_2A^1{}_mB_mX_{3m+2} \tag{4}$$

In the general formula (4), A$^2$ represents an organic cation with a carbon number greater than that of A$^1$. In the general formula (4), B and X are as defined for the general formula (2). For the preferred range and specific examples of A$^1$ and B in the general formula (4), one can refer to the preferred range and specific examples of A and B in the general formula (2), respectively. In the general formula (4), A$^1$ is as defined for the general formula (3). For the preferred range and specific examples of A$^1$ in the general formula (4), one can refer to the preferred range and specific examples of A$^1$ in the general formula (3).

The two instances of A$^2$, or the plural instances of X, may be the same as each other or not. When plural instances of A$^1$ or B are present, the plural instances of A$^1$ or B may be the same as each other or not.

The compound represented by the general formula (4) forms a layered structure in which inorganic layers formed from inorganic frameworks B$_m$X$_{3m+2}$ and organic layers formed from organic cations A$^2$ are alternately stacked. m corresponds to the number of stacked inorganic frameworks per inorganic layer, and is an integer from 1 to 100.

The organic cation represented by A$^2$ is an organic cation with a carbon number greater than that of A$^1$, preferably an ammonium represented by the general formula (6) above, more preferably an ammonium represented by the general formula (7) below.

$$(R^{12}{}_2C=NR^{13}{}_2)^+ \tag{7}$$

In the general formula (7), R$^{12}$ and R$^{13}$ each independently represent a hydrogen atom or a substituent, wherein one instance of R$^{12}$ may be the same as another one or not, and one instance of R$^{13}$ may be the same as another one or not. The substituents are not particularly limited, but include an alkyl group, an aryl group, an amino group, a halogen atom, and the like, wherein the alkyl group, the aryl group, or the amino group can be further substituted with an alkyl group, an aryl group, an amino group, a halogen atom, or the like. The number of carbons in the substituent as an alkyl group is preferably 1 to 30, more preferably 1 to 20, further preferably 1 to 10. In an aryl group, it is preferably 6 to 30, more preferably 6 to 20, further preferably 6 to 10. The thickness of the organic layer will depend on the length of the substituent represented by R$^{12}$ (e.g., the chain length of the alkyl group), whereby the characteristics of the functional layer formed from this mixture can be controlled. To make a combination of R$^{12}$ and R$^{13}$, an amino group or a halogen atom as R$^{12}$ and a hydrogen atom or an alkyl group as R$^{13}$ can be employed in combination, for example. Alternatively, an amino group or a halogen atom as R$^{12}$ and a hydrogen atom as R$^{13}$ can be employed in combination.

Besides an ammonium, the organic cation represented by A$^2$ can be formamidinium, cesium, or the like.

Specific preferred examples of the organic-inorganic perovskite-type compound represented by the general formula (4) include a compound represented by the general formula (4a) below.

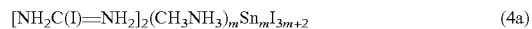
$$[NH_2C(I)=NH_2]_2(CH_3NH_3)_mSn_mI_{3m+2} \tag{4a}$$

In the general formula (4a), m is an integer from 2 to 100, preferably an integer from 2 to 5. Specifically, it can be [NH$_2$C(I)=NH$_2$]$_2$(CH$_3$NH$_3$)$_2$Sn$_2$I$_8$, [NH$_2$C(I)=NH$_2$]$_2$(CH$_3$NH$_3$)$_3$Sn$_3$I$_{11}$, or [NH$_2$C(I)=NH$_2$]$_2$(CH$_3$NH$_3$)$_4$Sn$_4$I$_{14}$. However, organic-inorganic perovskite-type compounds that may be used in the present invention are not limited to these compounds.

Among the perovskite-type compounds listed above, a preferred one is a compound represented by the general formula (2), particularly preferably one in which B is Sn$^{2+}$ or Pb$^{2+}$ and X is I$^-$ (tin iodide perovskite or lead iodide perovskite), most preferably (C$_6$H$_5$C$_2$H$_4$NH$_3$)$_2$SnI$_4$.

Such perovskite-type compounds can be used alone or in combination of two or more.

The total number of inorganic and organic layers in the two-dimensional perovskite layer is preferably 1 to 100, more preferably 1 to 50, further preferably 5 to 20.

Incidentally, the thickness of the two-dimensional perovskite layer is not particularly limited, but is preferably 50 nm or less, more preferably as thinner as possible but with no pinhole.

[Method to Produce the Two-Dimensional Perovskite]

A method to produce the two-dimensional perovskite is now described.

The method to produce a two-dimensional perovskite according to the present invention is characterized by forming a two-dimensional perovskite on a layer with an ammonium halide group disposed on its surface.

This causes, on the layer with an ammonium halide group disposed on its surface, octahedral inorganic frameworks to be disposed in an ordered fashion to form an inorganic layer, on which organic cations and then inorganic frameworks are further disposed in an ordered fashion to form a two-dimensional perovskite layer made of these alternately stacked organic and inorganic layers. The two-dimensional perovskite layer thus formed will contain very few defects and thus can provide a high carrier mobility.

Hereafter, a method to produce the two-dimensional perovskite according to the present invention is described in detail.

[1] Step to Form a Layer with an Ammonium Halide Group Disposed on its Surface

In the present invention, prior to forming a two-dimensional perovskite layer, a layer with an ammonium halide group disposed on its surface is formed. The layer with an ammonium halide group disposed on its surface can be formed by supplying a compound that has an ammonium halide group to the support surface, using spin coating or dip coating.

Specifically, the layer with an ammonium halide group disposed on its surface can be obtained by forming, on the support surface, a self-assembled monolayer that has the ammonium halide group. The self-assembled monolayer can be formed from a molecule that has an ammonium halide group at one terminal and a different functional group at the other terminal, wherein the different functional group can chemically react with a functional group on the support surface. When such a molecule is brought into contact with the support surface, the chemical reaction between the different functional group in the molecule and the functional group on the support surface will cause the molecule to be chemisorbed on the support surface, forming a monolayer with the ammonium halide group oriented outward (on an opposite side to the support). As a result, a layer with ammonium halide groups densely disposed on its surface can be obtained.

Also, the layer with an ammonium halide group disposed on its surface can also be formed by: bringing a molecule that has an amino group at one terminal and the different functional group at the other terminal into contact with the support to form a self-assembled monolayer with the amino group oriented outward; and then performing a step of converting that amino group to an ammonium halide group. The method to convert the amino group to the ammonium halide group can be a treatment with a hydrogen halide or the like.

For the ammonium halide group, the different functional group, and the linker to join the ammonium halide group and the different functional group, one can refer to the relevant part of the foregoing section [Two-Dimensional Perovskite Forming Material].

The contact of the molecule with the support may be achieved by bringing a solution of that molecule into contact with the support, or bringing a vapor of that molecule into contact with the support. The method to bring the solution into contact with the support can be spin coating or dip coating, and is preferably dip coating because it can form a dense monolayer. The solvent to dissolve the molecule can be the same as the solvent in the coating solution used in the next step [2].

Also, the layer with an ammonium halide group disposed on its surface may be formed using the Langmuir-Blodgett process based on the physisorption of molecules, or a monolayer formation process based on the electrostatic adsorption of molecules. In this case, the material of the monolayer is a molecule that has an ammonium halide or amino group at one terminal and a group at the other terminal capable of physisorption (hydrophobic group) or electrostatic adsorption by the support surface. When such a molecule with a terminal amino group is employed, a step to convert the amino group to an ammonium halide group is required after the monolayer is formed. For details of this step, one can refer to the specific examples of the step of converting the amino group in a self-assembled monolayer to a halogenated amino group.

[2] Step to Form a Two-Dimensional Perovskite

This step forms a two-dimensional perovskite on the layer with an ammonium halide group disposed on its surface.

The method to form the two-dimensional perovskite is not particularly limited, and can be a gas-phase process such as vacuum deposition, or can be solution deposition. Preferably, it is solution deposition because it allows layer formation using simple equipment in a short time. Hereafter, a method to form the two-dimensional perovskite layer by solution deposition is described.

First, a coating solution that contains a perovskite-type compound or its precursor is prepared. The perovskite-type compound $(R_4N)_2BX_4$ can be synthesized by reacting the ammonium halide $R_4NX$ with the metal halide $BX_2$ in a solvent as shown in the reaction equation (8) below, for example.

$$2 \cdot R_4NX + BX_2 \rightarrow (R_4N)_2BX_4 \quad (8)$$

In the reaction equation (8), R is as defined for the general formula (5) above, and B and X are as defined for the general formula (2). The coating solution is prepared so that it will contain either the reaction product, i.e., the perovskite-type compound $(R_4N)_2BX_4$, or its precursor. Usually, the coating solution containing the product obtained by dissolving the reactants $R_4NX$ and $BX_2$ in a solvent and allowing them to react can be used.

Then, the prepared coating solution is applied to the support surface, and dried to provide a two-dimensional perovskite layer.

The method to apply the coating solution is not particularly limited, and can be a known conventional process such as gravure coating, bar coating, printing, spray coating, spin coating, dip coating, or die coating, and is preferably spin coating because it can form a uniform coating layer of a relatively small thickness.

The solvent in the coating solution is not particularly limited as long as it can dissolve the perovskite-type compound. Specifically, it can be an ester (methyl formate, ethyl formate, propyl formate, pentyl formate, methyl acetate, ethyl acetate, pentyl acetate, or the like), a ketone (γ-butyrolactone, N-methyl-2-pyrrolidone, acetone, dimethyl ketone, diisobutyl ketone, cyclopentanone, cyclohexanone, methyl cyclohexanone, or the like), an ether (diethyl ether, methyl-tert-butyl ether, diisopropyl ether, dimethoxymethane, dimethoxyethane, 1,4-dioxane, 1,3-dioxolane, 4-methyldioxolane, tetrahydrofuran, methyl tetrahydrofuran, anisole, phenetole, or the like), an alcohol (methanol, ethanol, 1-propanol, 2-propanol, 1-butanol, 2-butanol, tert-butanol, 1-pentanol, 2-methyl-2-butanol, methoxypropanol, diacetone alcohol, cyclohexanol, 2-fluoroethanol, 2,2,2-trifluoroethanol, 2,2,3,3-tetrafluoro-1-propanol, or the like), a glycol ether (cellosolve) (ethylene glycol monomethyl ether, ethylene glycol monoethyl ether, ethylene glycol monobutyl ether, ethylene glycol monoethyl ether acetate, triethylene glycol dimethyl ether, or the like), an amide solvent (N,N-dimethyl formamide, acetamide, N,N-dimethyl acetamide, or the like), a nitrile solvent (acetonitrile, isobutyronitrile, propionitrile, methoxyacetonitrile, or the like), a carbonate agent (ethylene carbonate, propylene carbonate, or the like), a halogenated hydrocarbon (methylene chloride, dichloromethane, chloroform, or the like), a hydrocarbon (n-pentane, cyclohexane, n-hexane, benzene, toluene, xylene, or the like), dimethyl sulfoxide, or the like. It can also have two or more of ester, ketone, ether, and alcohol functional groups (i.e., —O—, —CO—, —COO—, —OH), or it can be an ester, a ketone, an ether, or an alcohol in which a hydrogen atom in the hydrocarbon portion is replaced by a halogen atom (particularly a fluorine atom).

The amount of the perovskite-type compound contained in the coating solution is preferably 1 to 50% by mass based on the entire coating solution, more preferably 2 to 30% by mass, further preferably 5 to 20% by mass.

The amount of the coating solution applied is preferably 0.01 to 0.5 mg/cm$^2$, more preferably 0.02 to 0.4 mg/cm$^2$, further preferably 0.05 to 0.3 mg/cm$^2$.

Preferably, the coating solution on the support surface is dried by air-drying or heat drying under an atmosphere replaced by an inert gas such as nitrogen.

[Elements]

Elements according to the present invention are now described.

An element according to the present invention is characterized by comprising the stacked structure according to the present invention. The stacked structure according to the present invention is comprised of a two-dimensional perovskite layer and a layer with an ammonium halide group disposed on its surface, which provides a high carrier mobility. Also, this stacked structure can acquire flexibility by molecular design of the organic cation in the two-dimensional perovskite layer and choice of the support, and can be produced at a low cost by forming the two-dimensional perovskite layer by solution deposition. Therefore, an element according to the present invention comprising this stacked structure can have a high performance as a result of the high carrier mobility of the two-dimensional perovskite layer, can be flexibilizd, and is advantageous in reducing the production cost.

An element according to the present invention can be various semiconductor-based elements such as a transistor, a photoelectric conversion element, or a light-emitting element. Specifically, it is preferably a transistor, more preferably a top-contact transistor, further preferably a top-contact/top-gate transistor. The top-contact transistor as an element according to the present invention can provide a high carrier mobility and a high current on/off ratio, and the top-contact/top-gate transistor can further improve the carrier mobility and threshold voltage.

Hereafter, top-contact transistors are discussed as a specific example of elements according to the present invention.

Figure 3:
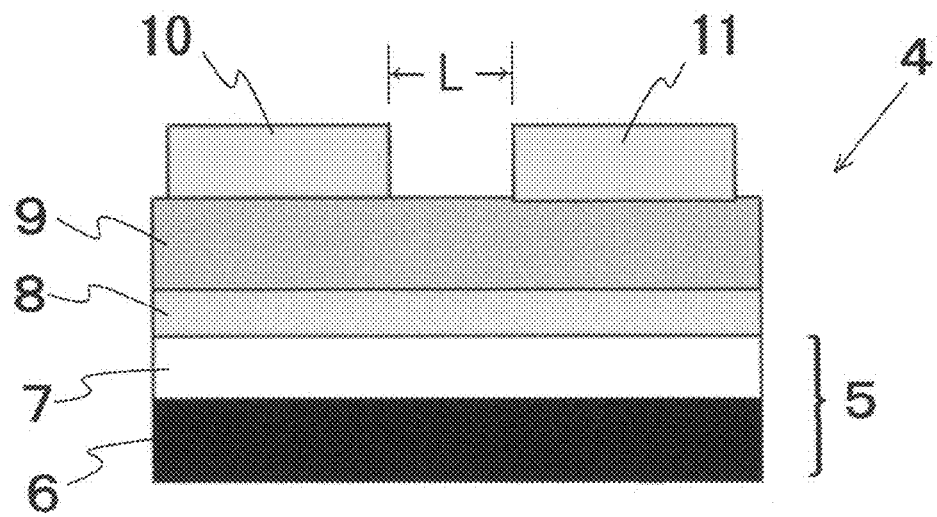
FIG. 3 A schematic vertical cross sectional view of an exemplary top-contact/bottom-gate transistor based on the present invention.

FIG. 3 shows a schematic vertical cross sectional view of an exemplary transistor based on the present invention (top-contact/bottom-gate transistor).

The transistor shown in FIG. 3 has: a support 5, a monolayer 8 formed on the surface of the support 5, a two-dimensional perovskite layer 9 formed on the monolayer 8, and a source electrode 10 and a drain electrode 11 provided on the two-dimensional perovskite layer 9. The monolayer 8 has a molecular structure that has a terminal ammonium halide group, which is disposed with the ammonium halide group oriented toward the two-dimensional perovskite layer 9. Also, the opposite terminal without an ammonium halide group in this molecular structure is chemisorbed on the surface of the support 5. In this transistor, the support 5, the monolayer 8, and the two-dimensional perovskite layer 9 forms a stacked structure 4 according to the present invention, wherein the two-dimensional perovskite layer 9 functions as a semiconductor layer in the transistor.

For details of the monolayer 8 and the two-dimensional perovskite layer 9 used in the stacked structure 4, one can refer to the description in the sections [Two-Dimensional Perovskite Forming Material] and [Stacked Structure].

The support 5 has a gate electrode 6 and an insulator 7 provided on the gate electrode 6. The materials of the gate electrode 6 and the insulator 7 are not particularly limited, but preferably the gate electrode 6 is a layer whose major constituent is silicon and the insulator 7 is a layer whose major constituent is silicon dioxide. Such a support 5 can be readily obtained by thermally oxidizing the silicon substrate to convert it into silicon dioxide around the surface.

The source electrode 10 and the drain electrode 11 are provided on the two-dimensional perovskite layer 9 in the stacked structure 4, spaced apart from each other. In this transistor, the width of the source electrode 10/drain electrode 11 corresponds to the channel width, and the distance between the source electrode 10 and the drain electrode 11 corresponds to the channel length L. In general, the channel length L is parallel to the plane in which the inorganic frameworks are disposed in the two-dimensional perovskite layer 9 (a plane perpendicular to the thickness). This allows the carriers injected into the two-dimensional perovskite layer to easily move along the channel length L, providing a high carrier mobility. The channel length L is not particularly limited, but is preferably 0.02 to 1000 μm, more preferably 1 to 750 μm, further preferably 350 to 500 μm.

The material of the source electrode 10 or the drain electrode 11 is not particularly limited, but can be a conductive metal material, such as Au, Ag, Cu, Pt, Ni, Cr, Ti, Ta, Al, Ca, Cs, or Mg, or an alloy comprising any one of these, and two or more of them can be used in combination.

Preferably, a transition metal oxide layer is provided between the two-dimensional perovskite layer 9 and at least one of the source electrode 10 and the drain electrode 11. This can suppress the effect of the carrier injection barrier between the two-dimensional perovskite layer 9 and the source electrode 10/drain electrode 11, providing both a higher carrier mobility and a lower threshold voltage. The transition metal oxide layer can be a molybdenum oxide layer, a rhenium oxide layer, a tungsten oxide layer, or the like, and is preferably a molybdenum oxide layer. The thickness of the transition metal oxide layer is not particularly limited, but preferably 0.5 to 5 nm, more preferably 1 to 4 nm, further preferably 1.5 to 3 nm.

Preferably, between the two-dimensional perovskite layer 9 and at least one of the source electrode 10 and the drain electrode 11, an organic layer with a LUMO level shallower than the Fermi level of the source/drain electrode is provided. This will enhance the electron injection efficiency from the source electrode 10 into the two-dimensional perovskite layer 9, facilitating their behavior as an n-type transistor. The material of such an organic layer can be $C_{60}$, PCBM, PTCDI, F16-CuPC, or the like.

In such a transistor, when in an OFF state, i.e., no voltage being applied to the gate electrode 6, only a very small electric current will be generated even if a voltage is applied between the source electrode 10 and the drain electrode 11, because the two-dimensional perovskite layer 9 contains almost no carriers.

On the other hand, when in an ON state, i.e., a voltage being applied to the gate electrode 6, carriers will be injected from the source electrode 10 into the two-dimensional perovskite layer 9, and accumulate in the two-dimensional perovskite layer 9 to form a channel (flow path for carriers). When a voltage is applied between the source electrode 10 and the drain electrode 11 in this state, the carriers will move through the channel region to output a drain current.

Figure 4:
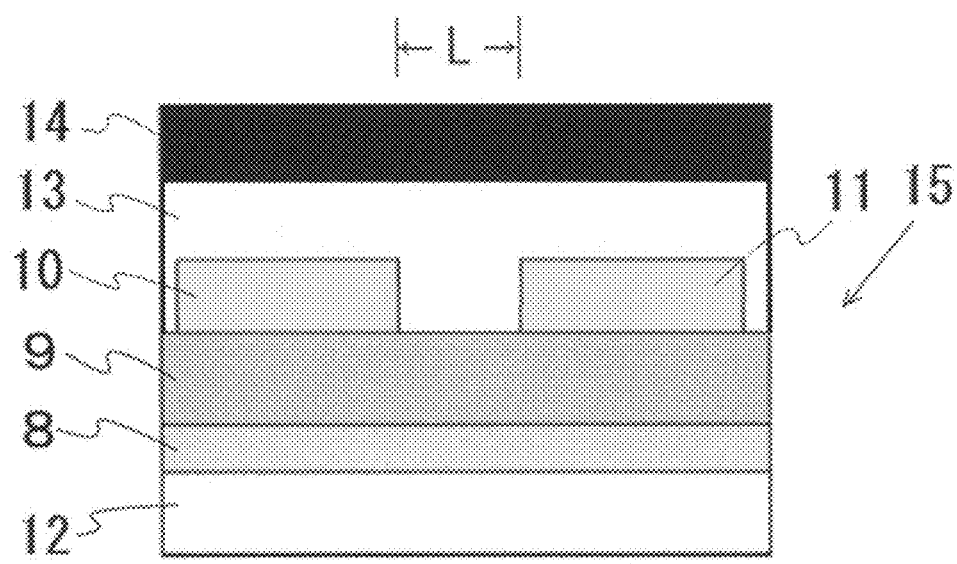
FIG. 4 A schematic vertical cross sectional view of an exemplary top-contact/top-gate transistor based on the present invention.

FIG. 4 shows a schematic vertical cross sectional view of another exemplary transistor based on the present invention (top-contact/top-gate transistor).

The transistor shown in FIG. 4 has: a support 12, a monolayer 8 formed on the surface of the support 12, a two-dimensional perovskite layer 9 formed on the monolayer 8, a source electrode 10 and a drain electrode 11 provided on the two-dimensional perovskite layer 9, an insulator 13 provided to cover the two-dimensional perovskite layer 9, the source electrode 10, and the drain electrode 11, and a gate electrode 14 provided on the insulator 13. In this transistor, the support 12, the monolayer 8, and the two-dimensional perovskite layer 9 forms a stacked structure 15 according to the present invention, wherein the two-dimensional perovskite layer 9 functions as a semiconductor layer in the transistor.

As used in the stacked structure 4, for detailed description, the preferred range, and specific examples of the monolayer 8 and the two-dimensional perovskite layer 9, the source electrode 10 and the drain electrode 11, and the transition metal oxide layer or organic layer that may be provided between the two-dimensional perovskite layer 9 and at least one of the source electrode 10 and the drain electrode 11, one can refer to the relevant part of the foregoing description of top-contact/bottom-gate transistor.

The support 12 supports other members formed on it. The support 12 can be, for example, a glass substrate, a plastic substrate made of polyethylene terephthalate (PET), polyethylene naphthalate (PEN), polyether sulfone (PES), aromatic polyester (liquid crystal polymer), polyimide (PI) or the like (a resin substrate), a quartz substrate, a silicon substrate, a metal substrate, a gallium arsenide substrate, or the like.

The material of the insulator 13 can be a known insulator material used for a gate insulator layer, and may be either an organic material or an inorganic material.

The organic material can be polymethyl methacrylate, polyvinylphenol, polyimide, polystyrene, polyvinyl alcohol, polyvinyl acetate, polyvinyl phenol, fluororesin, or the like, and two or more of them can be used in combination.

The inorganic material can be a metal oxide such as silica, silicon nitride, aluminum oxide, or tantalum oxide, or a complex metal oxide such as barium strontium titanate or lead zirconate titanate, and two or more of them can be used in combination.

The material of the gate electrode 14 can be the same as one of the exemplary materials of the source electrode 10 and the drain electrode 11.

EXAMPLES

Hereafter, with reference to Examples and Comparative Examples, features of the present invention are more specifically described. Materials, details of processes, process steps, and the like as shown below can be changed as appropriate without departing from the spirit of the present invention. Accordingly, the scope of the present invention should not be construed as limited by specific examples as shown below. X-ray diffraction analyses were performed using X-ray diffractometer (Ultima IV, Rigaku), absorption spectroscopy was performed using a UV-Vis-NIR spectrometer (LAMBDA950, Perkin Elmer), transient photoluminescence decay curves were obtained using a compact fluorescence lifetime spectrometer (Quantaurus-Tau, Hamamatsu Photonics), and transistor characteristics were assessed using a semiconductor device analyzer (B1500A, Agilent). Atomic force microscopy images were taken using an atomic force microscope (JSPM-5400, JEOL), energy levels were determined using a photoelectron yield spectrometer (AC-3, Riken Keiki) and a low-energy inverse photoemission spectrometer (LE-1, ALS Technology). The carrier mobility $\mu$ and threshold voltage $V_{th}$ of transistors were calculated using the following equation (1).

$$I_{d,sat} = \frac{\mu WC(V_g - V_{th})^2}{2L} \quad (1)$$

In the equation (1), $I_{d,sat}$ represents saturated drain current, W represents channel width, C represents gate capacity, $V_g$ represents gate voltage, and $V_{th}$ represents threshold voltage.

The thickness of a perovskite layer was determined using a profilometer (DektakXT, Bruker).
<Fabrication of Stacked Structure>

Example 1

A silicon substrate (support) with a silicon dioxide layer formed on its surface was prepared.

On the silicon dioxide layer of this silicon substrate, a monolayer with an ammonium iodide group ($NH_3I$ group) and then a two-dimensional perovskite layer were formed as follows.

First, in a glovebox under a nitrogen atmosphere, (EtO)$_3$Si(CH$_2$)$_3$NH$_2$ was dissolved in toluene to prepare a 1 mM solution. In this solution heated to 80° C., the silicon substrate was immersed for 12 hours, which was then rinsed several times with toluene, to form a monolayer that had a molecular structure represented by (—O—)$_3$Si(CH$_2$)$_3$NH$_2$. Subsequently, in the air, the silicon substrate with the formed monolayer was immersed in aqueous HI (1 mM) for 1 minute and then rinsed several times with pure water, to convert the amino group (NH$_2$ group) to an ammonium iodide group (NH$_3$I group), providing a monolayer that had a molecular structure represented by (—O—)$_3$Si(CH$_2$)$_3$NH$_3$I. The formation of the monolayer was confirmed by determining the state of chemical bonds of elements that constituted the surface using X-ray photoemission spectroscopy.

Then, PEAI(C$_6$H$_5$C$_2$H$_4$NH$_3$I) and tin iodide (SnI$_2$) were dissolved at a molar ratio of 2:1 in dehydrated methanol, and allowed to react under stirring to produce a precursor of PEASnI$_4$[(C$_6$H$_5$C$_2$H$_4$NH$_3$)$_2$SnI$_4$]. The amount of the PEASnI$_4$ precursor thus obtained in the solution was 100 mg/mL. Under a nitrogen atmosphere, this solution was applied to the monolayer formed in the previous step by spin coating at 3000 rpm for 120 seconds, which was then heated on a hot plate at 80° C. for 10 minutes. This step formed a PEASnI$_4$ layer (two-dimensional perovskite layer) with a thickness of 0.04 µm.

These steps provided a stacked structure that was comprised of a PEASnI$_4$ layer and a support with NH$_3$I groups disposed on its surface.

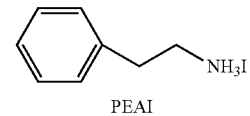

PEAI

Comparative Example 1

A stacked structure (a stacked structure composed of a support and a PEASnI$_4$ layer) was fabricated in the same manner as in Example 1, except that the monolayer with an ammonium iodide group was not formed and the PEASnI$_4$ layer was formed directly on the silicon dioxide layer.

Comparative Example 2

A stacked structure (a stacked structure comprised of a PEASnI$_4$ layer and a support with NH$_2$ groups disposed on its surface) was fabricated in the same manner as in Example 1, except that the step of converting the amino group (NH$_2$ group) to an ammonium iodide group (NH$_3$I group) was omitted after the monolayer that had a molecular structure represented by (—O—)$_3$Si(CH$_2$)$_3$NH$_2$ was formed on the silicon dioxide layer, and the PEASnI$_4$ layer was formed directly on this monolayer. The formation of the monolayer was confirmed by determining the state of chemical bonds of elements that constituted the surface using X-ray photoemission spectroscopy.

Figure 5:
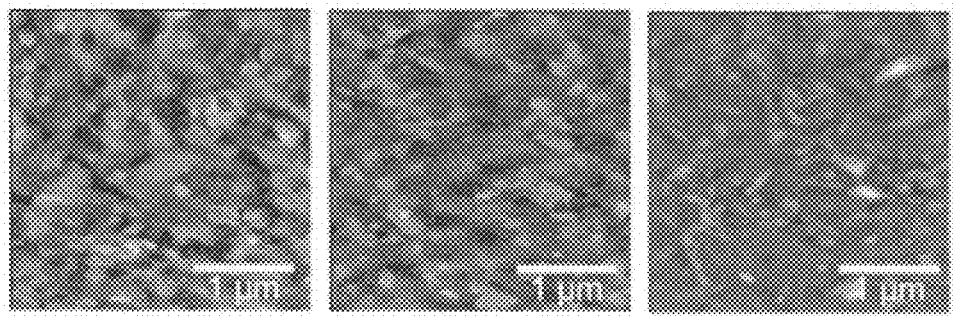
FIG. 5 Atomic force microscopy images of the surface of $PEASnI_4$ layers formed in Example 1 and Comparative Examples 1 and 2.
Figure 6:
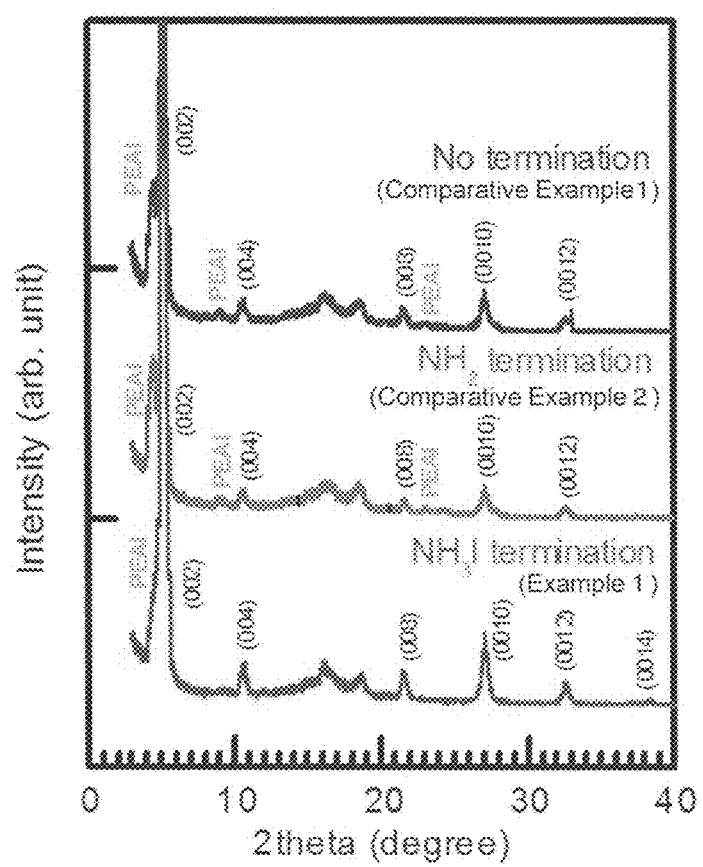
FIG. 6 X-ray diffraction spectra of the $PEASnI_4$ layers formed in Example 1 and Comparative Examples 1 and 2.
Figure 7:
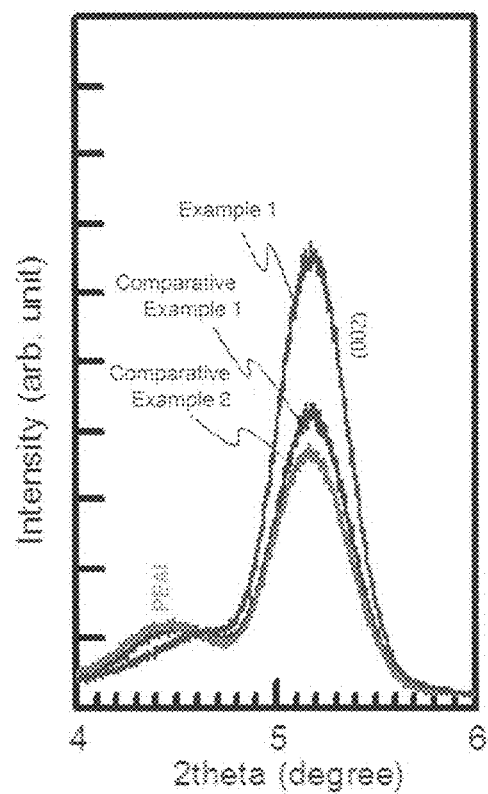
FIG. 7 X-ray diffraction spectra that show the (002) diffraction and PEAI peaks extracted from the X-ray diffraction spectra in FIG. 6.
Figure 8:
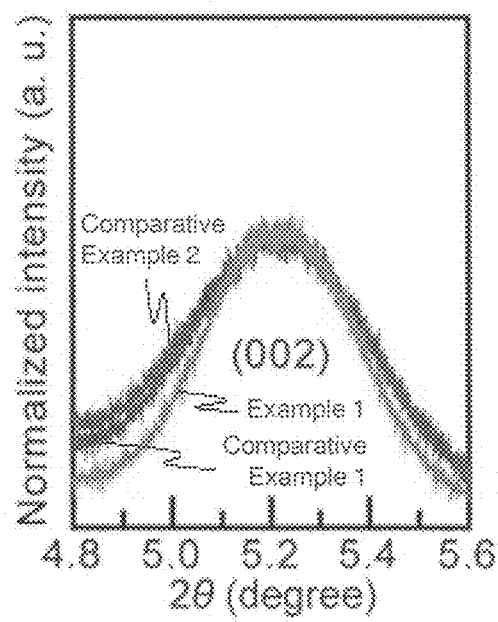
FIG. 8 X-ray diffraction spectra obtained by normalizing the X-ray diffraction spectra shown in FIG. 7 to have the same intensity for their (002) diffraction peaks.
Figure 9:
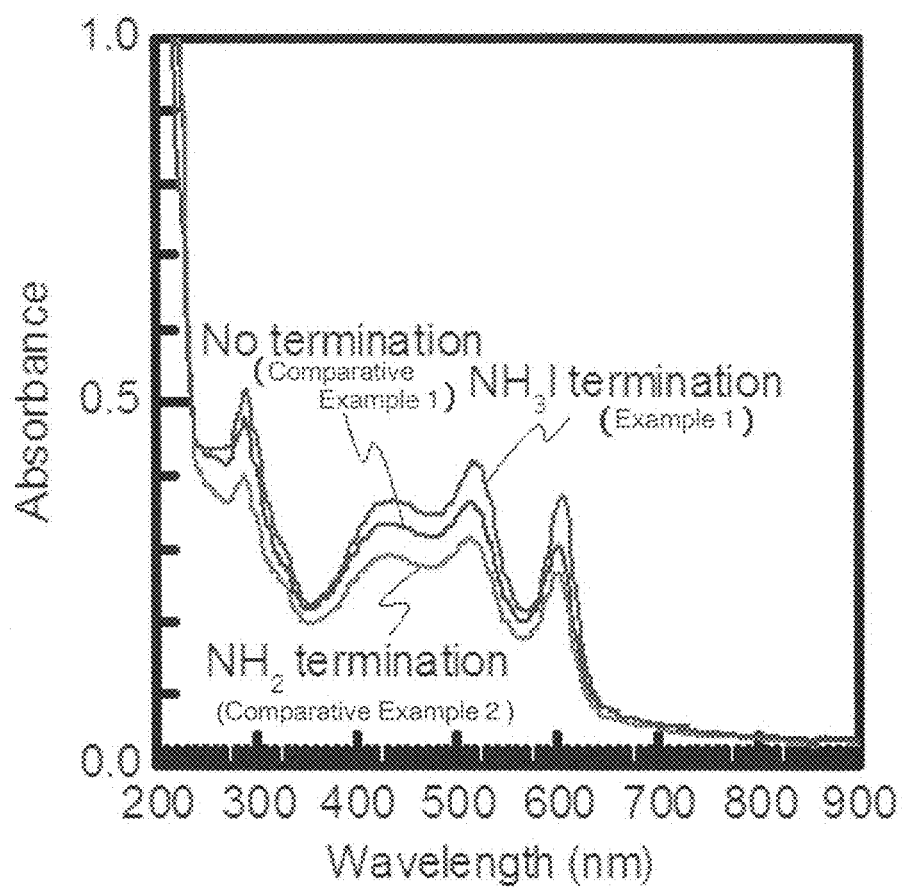
FIG. 9 absorption spectra of the $PEASnI_4$ layers formed in Example 1 and Comparative Examples 1 and 2.
Figure 10:
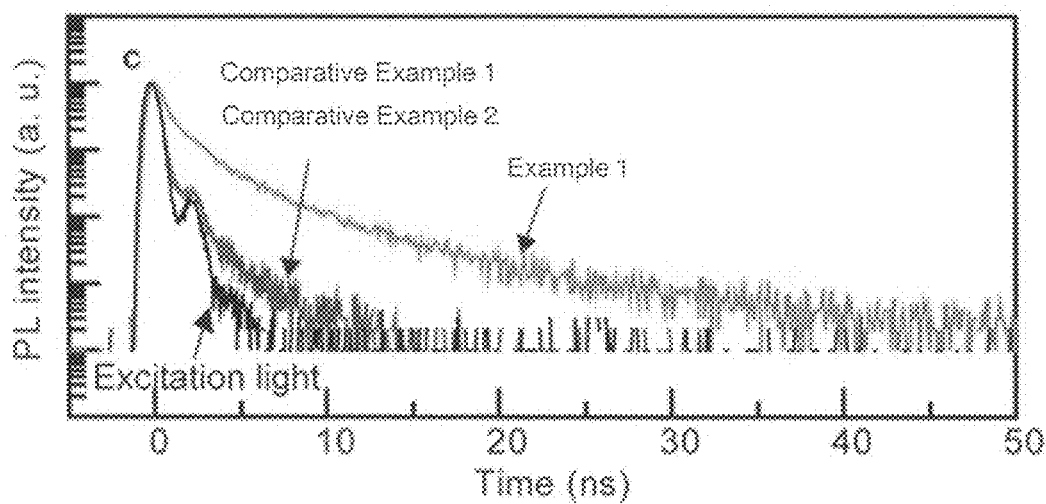
FIG. 10 A transient photoluminescence decay curve for the $PEASnI_4$ layers formed in Example 1 and Comparative Examples 1 and 2 under 405 nm excitation light.
Figure 11:
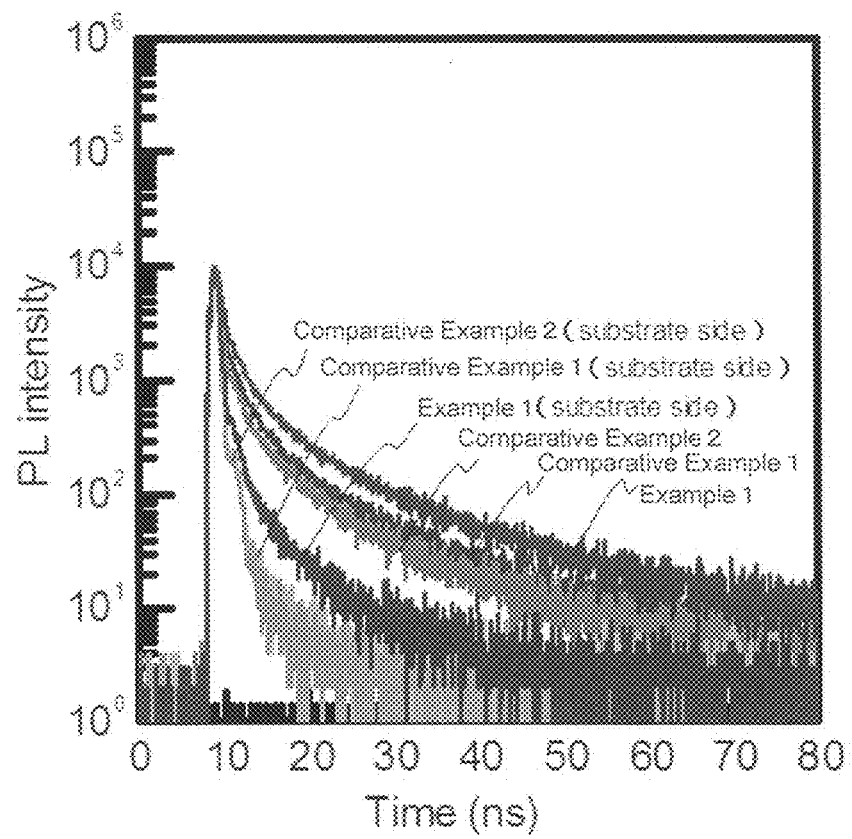
FIG. 11 A transient photoluminescence decay curve for $PEASnI_4$ layers formed in the same manner as in Example 1 and Comparative Examples 1 and 2, except that a fused quartz was used as the support and the thickness was 130 nm, under 405 nm excitation light.

With regard to the PEASnI$_4$ layers thus formed in Example 1 and Comparative Examples 1 and 2, atomic force microscopy images of their surface are shown in FIG. 5, X-ray diffraction results are shown in FIG. 6, and (002) diffraction and PEAI peaks extracted from the X-ray diffraction spectra in FIG. 6 are shown in FIG. 7. FIG. 8 shows the X-ray diffraction spectra in FIG. 7 normalized to have the same intensity for their (002) diffraction peaks. Also, the PEASnI$_4$ layers in Example 1 and Comparative Examples 1 and 2 were formed on a fused quartz and their absorption spectra were determined as shown in FIG. 9. Also, their transient photoluminescence decay curve for 623 nm emission in response to 405 nm excitation is shown in FIGS. 10 and 11. FIG. 10 shows transient photoluminescence decay curves for the PEASnI$_4$ layers formed in Example 1 and Comparative Examples 1 and 2. FIG. 11 shows transient photoluminescence decay curves for PEASnI$_4$ layers formed in the same manner as in Example 1 and Comparative Examples 1 and 2, except employing a fused quartz support and a thickness of 130 nm of the PEASnI$_4$ layer. In FIG. 11, "substrate side" indicates irradiation with the excitation light from the substrate side (from the bottom), and the transient photoluminescence decay curves not marked with "substrate side" indicates irradiation with the excitation light from the PEASnI$_4$ layer side (from the top).

As determined from X-ray diffraction peaks (002, 004, 008, 0010, and 0012) in FIG. 6, the interplanar spacing d of the perovskite was 16.4 angstroms. The diffraction peaks observed in this X-ray diffraction analysis all came from the (001) planes, demonstrating that, in the two-dimensional perovskite layers formed in Example 1 and Comparative Examples 1 and 2, each inorganic layer was formed in parallel to the support surface.

By comparing peaks in the three spectra in FIG. 7, it can be seen that the stacked structure in Example 1 has a (002) diffraction peak by far larger than the (002) diffraction peak of others, and a PEAI peak smaller than the PEAI peak of others. Also, three (002) diffraction peaks in FIG. 8 show that the peak width is smaller in Example 1. These indicate that the two-dimensional perovskite layer formed in Example 1 had a larger crystallite size and a greater crystalline proportion than the two-dimensional perovskite layer formed in Comparative Examples 1 and 2, and had the material PEAI more efficiently turned into the two-dimensional perovskite layer.

The absorption spectra in FIG. 9 indicate that the stacked structure in Example 1 has the greatest absorption. This demonstrates that the two-dimensional perovskite layer formed in Example 1 is a better layer than the two-dimensional perovskite layers formed in Comparative Examples 1 and 2.

Each transient photoluminescence decay curve in FIGS. 10 and 11 shows a decay with a long tail, suggesting the presence of defects in the two-dimensional perovskite layers formed in Example 1 and Comparative Examples 1 and 2. However, in the two-dimensional perovskite layer formed in Example 1, the transient photoluminescence decay curve shows a decay at a lower rate than the transient photoluminescence decay curve for others, and the photoluminescence quantum yield was 1.6±0.4%, which value was by far greater than the photoluminescence quantum yield of 0.15±0.06% in Comparative Example 1 and the photoluminescence quantum yield of 0.11±0.08% in Comparative Example 2. This indicates that the two-dimensional perovskite layer formed in Example 1 had fewer defects than those formed in Comparative Examples 1 and 2. Also, any of the two-dimensional perovskite layers showed a higher rate of decay in the transient photoluminescence decay curve when irradiated with the excitation light from the substrate side (from the bottom) than when irradiated with the excitation light from the top. This suggested that most defects in the two-dimensional perovskite layer resided on the side toward the substrate, and the density of defects was lower on the opposite side to the substrate.

Atomic force microscopy was used to measure the surface roughness $R_a$ (arithmetic mean roughness) and $R_q$ (root mean square roughness) of the two-dimensional perovskite layer in each stacked structure. $R_a$ was 4.3 nm and $R_q$ was 6.2 nm in the stacked structure fabricated in Example 1, $R_a$ was 3.0 nm and $R_q$ was 3.8 nm in the stacked structure fabricated in Comparative Example 1, and $R_a$ was 3.4 nm and $R_q$ was 4.3 nm in the stacked structure fabricated in Comparative Example 2.

<Fabrication of Transistor>

Example 2

A silicon substrate (support) was prepared with a silicon dioxide layer formed on its surface.

On the silicon dioxide layer of this silicon substrate, under the same conditions as in Example 1, a monolayer that had a molecular structure represented by $(-O-)_3Si(CH_2)_3NH_3I$ was formed, on which a PEASnI$_4$ layer (two-dimensional perovskite layer) was formed as a semiconductor layer. On this PEASnI$_4$ layer, by vacuum deposition under a vacuum of $10^{-4}$ Pa, Au was deposited to a thickness of 50 nm through a contact shadow mask to form source and drain electrodes. The distance between the source electrode and the drain electrode (channel length L) was 194 μm, and the channel width was 2 mm.

These steps provided a top-contact/bottom-gate transistor.

Various top-contact/bottom-gate transistors were also fabricated by the same steps as described above, except employing different channel lengths L.

Example 3

A silicon substrate (support) with a silicon dioxide layer formed on its surface was prepared.

On the silicon dioxide layer of this silicon substrate, a monolayer that had a molecular structure represented by $(-O-)_3Si(CH_2)_3NH_3I$ was formed under the same conditions as in Example 1, on which source and drain electrodes were formed under the same conditions as in Example 2. Subsequently, a PEASnI$_4$ layer as a semiconductor layer was formed all over the monolayer between these electrodes under the same conditions as in Example 1.

These steps provided a bottom-contact/bottom-gate transistor.

Various bottom-contact/bottom-gate transistors were also fabricated by the same steps as described above, except employing different channel lengths L.

Example 4

A silicon substrate (support) with a silicon dioxide layer formed on its surface was prepared. On this silicon dioxide layer, a monolayer that had a molecular structure represented by $(-O-)_3Si(CH_2)_3NH_3I$ and a PEASnI$_4$ layer (semiconductor layer) were formed under the same conditions as in Example 2, except employing different spin coating conditions for the PEASnI$_4$ layer. Here, the PEASnI$_4$ layer was formed by spin coating at 3000 rpm to a thickness of 40 nm. On this PEASnI$_4$ layer, MoOx (x=2.6 to 2.7) was deposited through a contact shadow mask to a thickness of 2 nm by vacuum deposition under a vacuum of $10^{-4}$ Pa, on which Au was deposited to a thickness of 50 nm, to form an MoOx layer and source and drain electrodes.

These steps provided top-contact/bottom-gate transistors with different channel lengths L.

Figure 12:
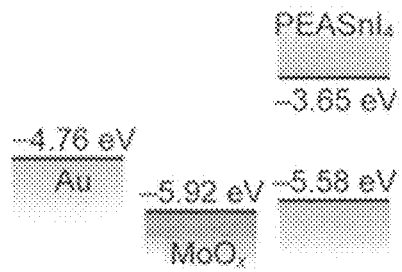
FIG. 12 An energy level diagram of the Au, MoOx, and $PEASnI_4$ layers formed in Example 4.

FIG. 12 shows an energy level diagram for the Au layer (source electrode and drain electrode), the MoOx layer, and the PEASnI$_4$ layer thus formed.

Example 5

A top-contact/bottom-gate transistor was fabricated in the same manner as in Example 4, except that C$_{60}$ was deposited to a thickness of 40 nm by vacuum deposition under a vacuum of 10$^{-4}$ Pa, to form a C$_{60}$ layer instead of the MoOx layer.

Example 6

On a fused quartz substrate, under the same conditions as in Example 1, a monolayer that had a molecular structure represented by (—O—)$_3$Si(CH$_2$)$_3$NH$_3$I was formed, on which a PEASnI$_4$ layer was formed as a semiconductor layer. On this PEASnI$_4$ layer, by vacuum deposition under a vacuum of 10$^{-4}$ Pa, MoOx (x=2.6 to 2.7) was deposited to a thickness of 2 nm through a contact shadow mask, on which Au was deposited to a thickness of 50 nm, to form an MoOx layer and source and drain electrodes with a channel width of 2 mm. Then, a fluororesin solution (CTL-809M, manufactured by AGC) was applied by spin coating at 7000 rpm for 30 seconds to cover the PEASnI$_4$ layer, the source electrode, and the drain electrode, which was then vacuum dried overnight to form a gate dielectric layer (insulator) with a thickness of 530 nm. Then, on the gate dielectric layer, Al was deposited to a thickness of 50 nm by vacuum deposition under a vacuum of 10$^{-4}$ Pa, to form a gate electrode.

These steps provided top-contact/top-gate transistors with different channel lengths L.

Example 7

A top-contact/top-gate transistor was fabricated in the same manner as in Example 6, except that C$_{60}$ was deposited to a thickness of 40 nm by vacuum deposition under a vacuum of 10$^{-4}$ Pa, to form a C$_{60}$ layer instead of the MoOx layer.

Figure 13:
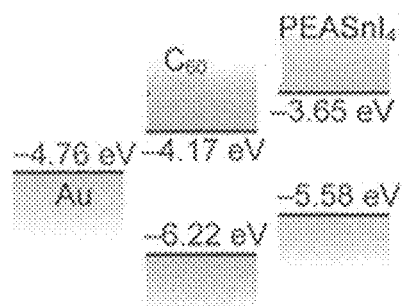
FIG. 13 An energy level diagram of the Au, $C_{60}$, and $PEASnI_4$ layers formed in Example 7.

An energy level diagram for the Au layer (source and drain electrodes), the C$_{60}$ layer, and the PEASnI$_4$ layer thus formed is shown in FIG. 13.

Comparative Example 3

A top-contact/bottom-gate transistor was fabricated in the same manner as in Example 2, except that the monolayer that had a molecular structure represented by (—O—)$_3$Si(CH$_2$)$_3$NH$_3$I was not formed and the PEASnI$_4$ layer was formed directly on the silicon dioxide layer.

Comparative Example 4

A top-contact/bottom-gate transistor was fabricated in the same manner as in Example 2, except that the step of converting the amino group (NH$_2$ group) to an ammonium iodide group (NH$_3$I group) was omitted after the monolayer that had a molecular structure represented by (—O—)$_3$Si(CH$_2$)$_3$NH$_2$ was formed on the silicon dioxide layer, and the PEASnI$_4$ layer was formed directly on this monolayer.

Comparative Example 5

A top-contact/top-gate transistor was fabricated in the same manner as in Example 6, except that the monolayer that had a molecular structure represented by (—O—)$_3$Si(CH$_2$)$_3$NH$_3$I was not formed, and the PEASnI$_4$ layer was formed directly on a fused quartz substrate.

Figure 14:
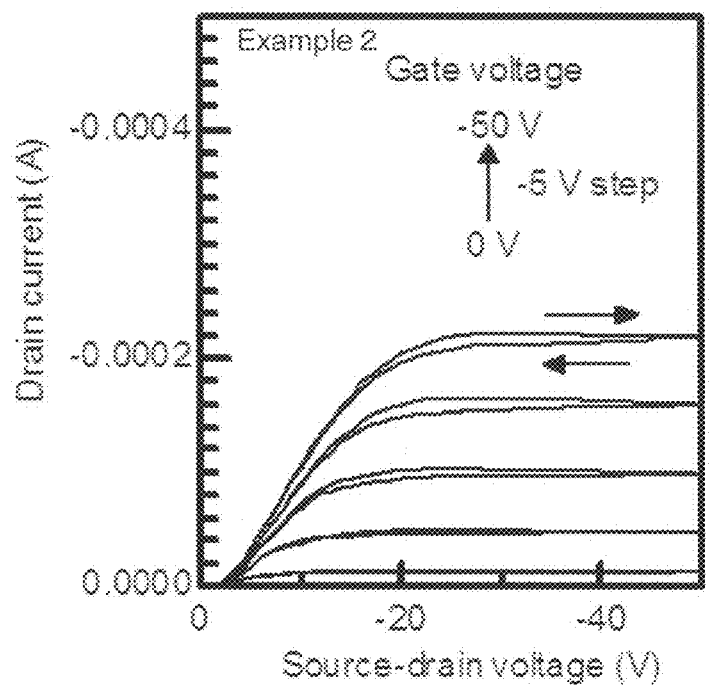
FIG. 14 Graphs that show the input/output characteristics of the transistor fabricated in Example 2. (a) A graph that shows the drain current-source-drain voltage characteristics. (b) A graph that shows the drain current-gate voltage characteristics.
Figure 14:
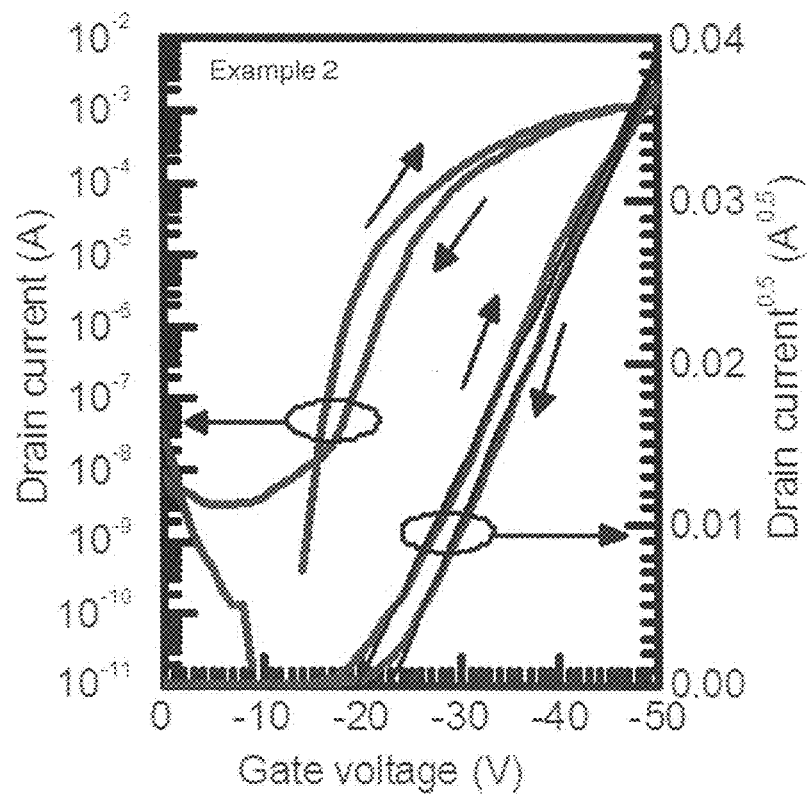
Figure 15:
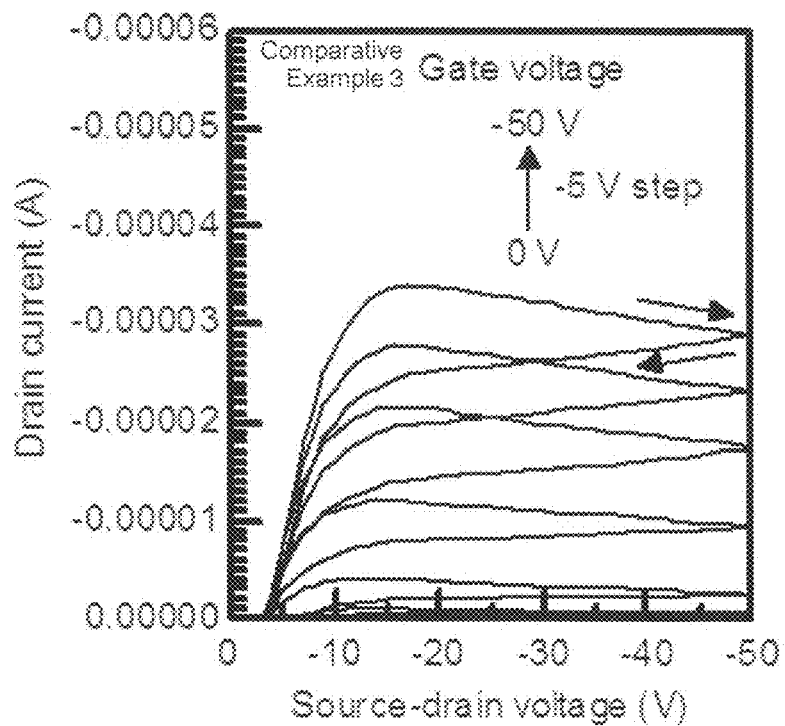
FIG. 15 Graphs that show the input/output characteristics of the transistor fabricated in Comparative Example 3. (a) A graph that shows the drain current-source-drain voltage characteristics. (b) A graph that shows the drain current-gate voltage characteristics.
Figure 15:
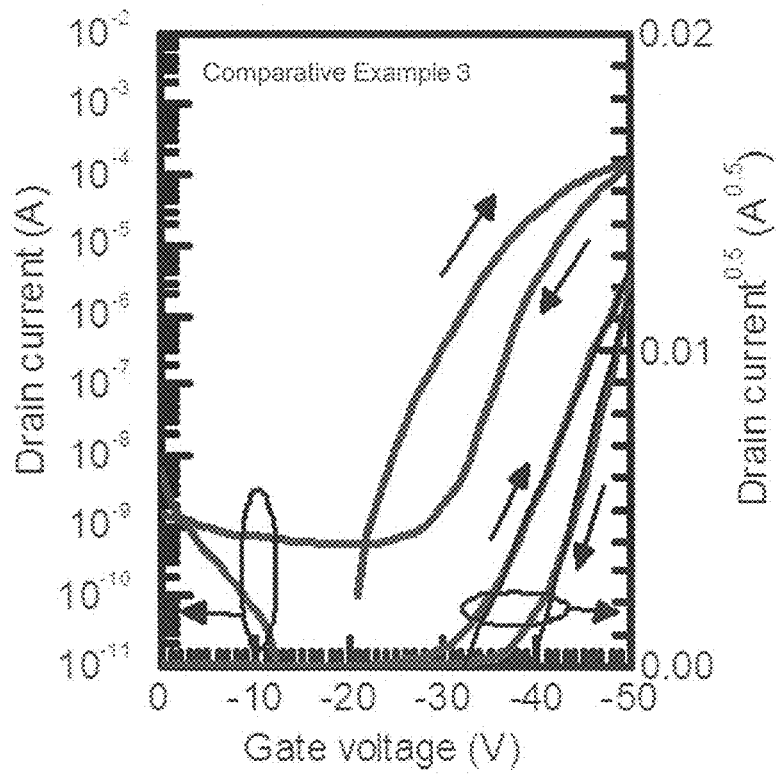
Figure 16:
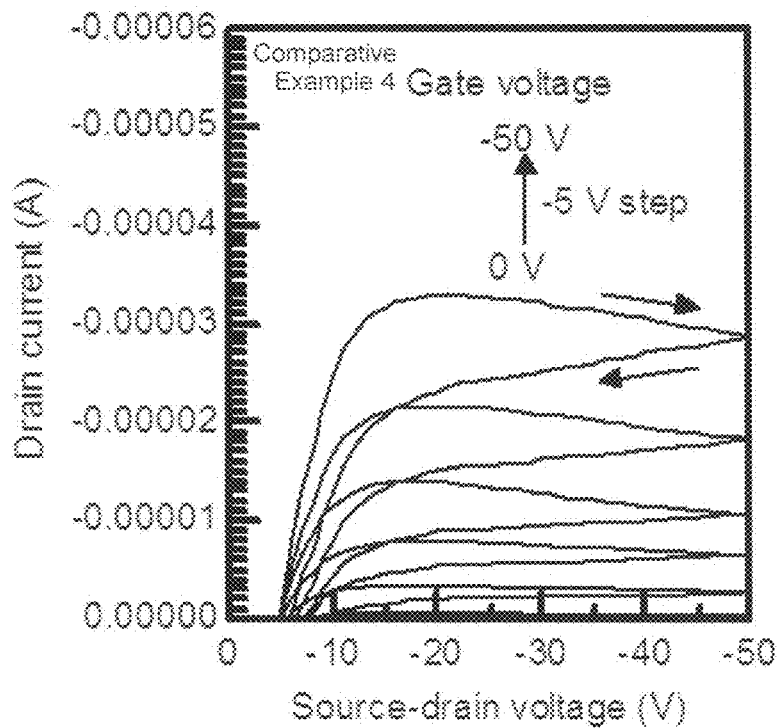
FIG. 16 Graphs that show the input/output characteristics of the transistor fabricated in Comparative Example 4. (a) A graph that shows the drain current-source-drain voltage characteristics. (b) A graph that shows the drain current-gate voltage characteristics.
Figure 16:
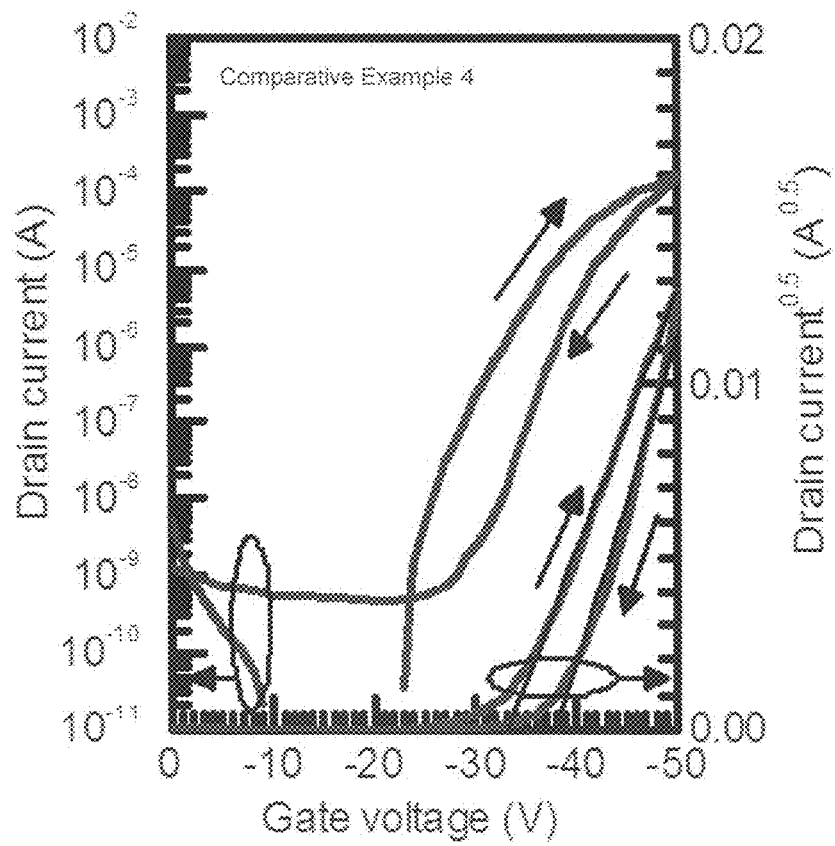
Figure 18:
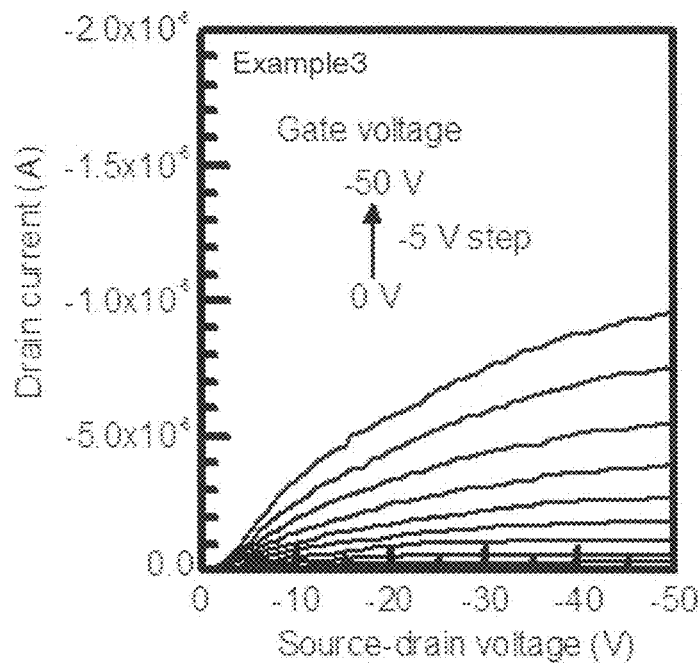
FIG. 18 Graphs that show the input/output characteristics of the transistor fabricated in Example 3. (a) A graph that shows the drain current-source-drain voltage characteristics. (b) A graph that shows the drain current-gate voltage characteristics.
Figure 18:
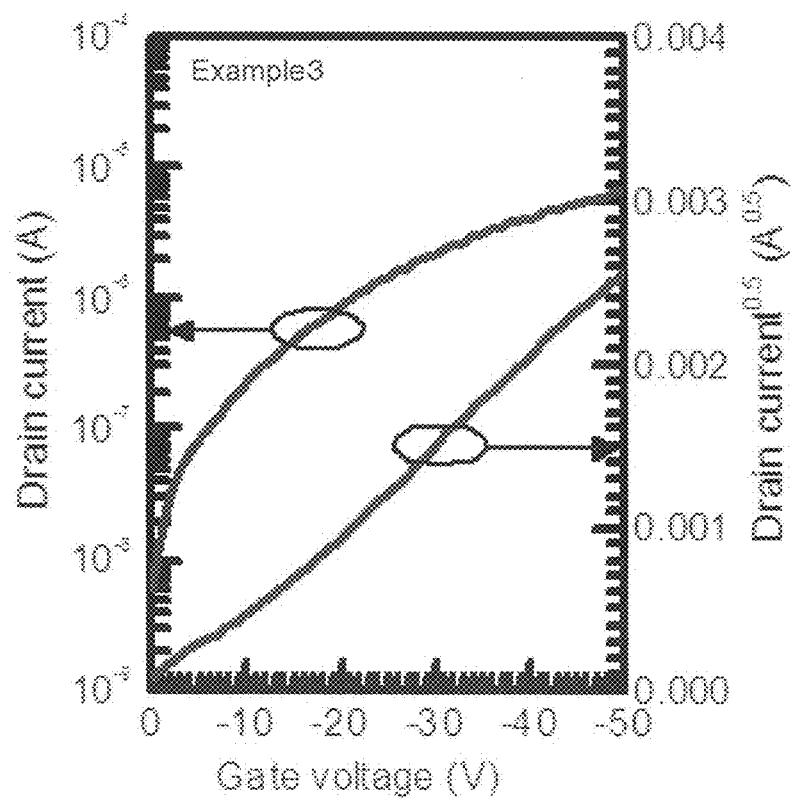
Figure 19:
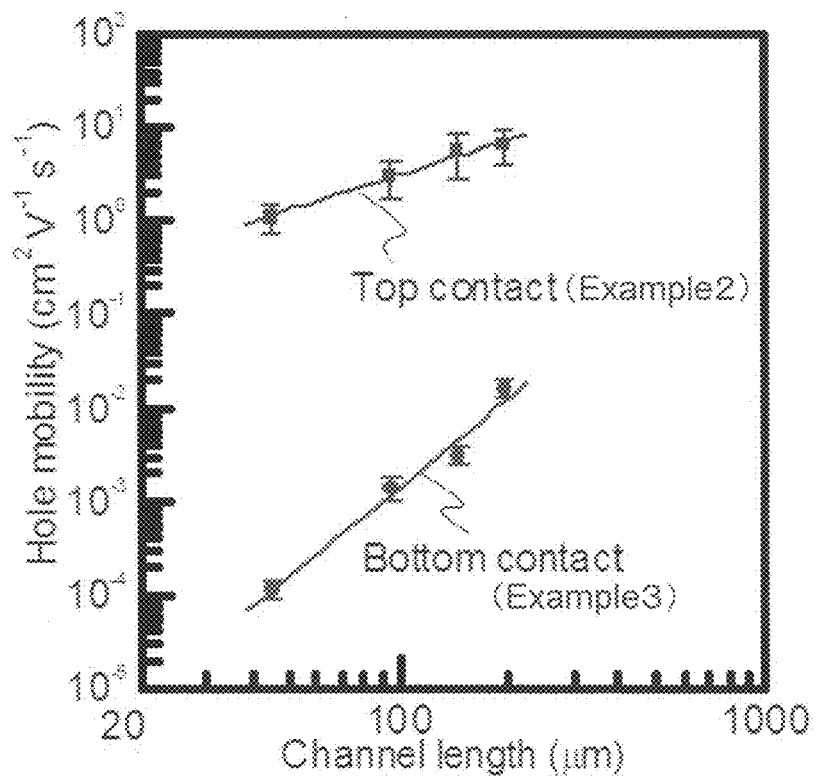
FIG. 19 A graph that shows the channel length dependence of the hole mobility of the transistors fabricated in Examples 2 and 3.
Figure 20:
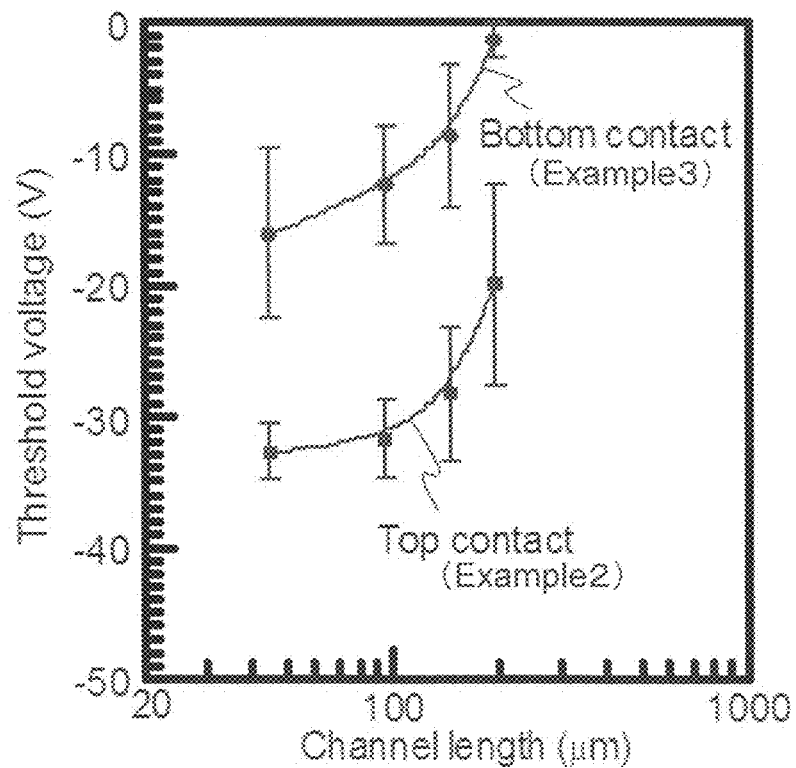
FIG. 20 A graph that shows the channel length dependence of the threshold voltage of the transistors fabricated in Examples 2 and 3.
Figure 21:
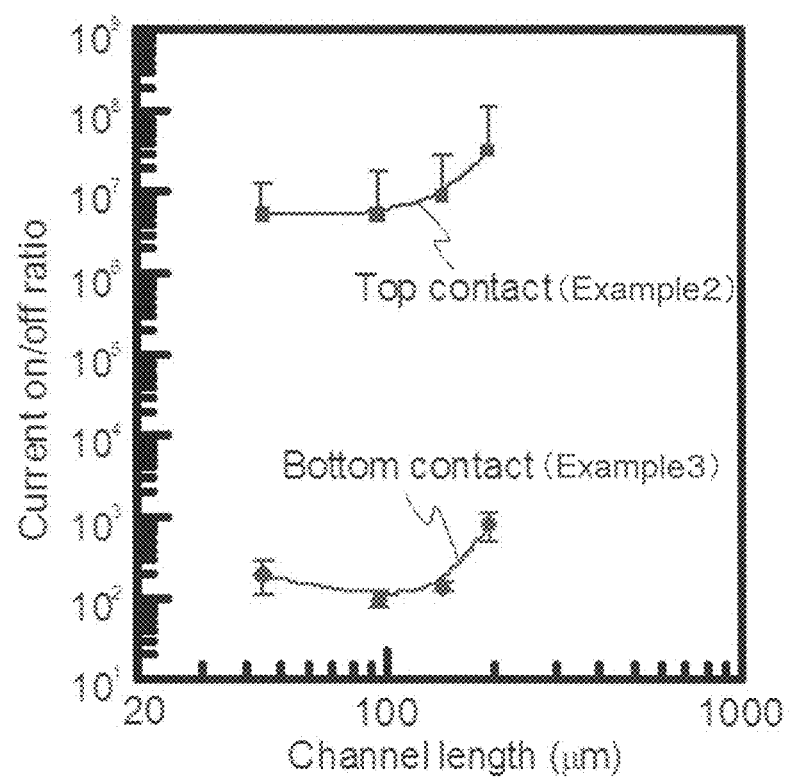
FIG. 21 A graph that shows the channel length dependence of the current on/off ratio of transistors fabricated in Examples 2 and 3.
Figure 22:
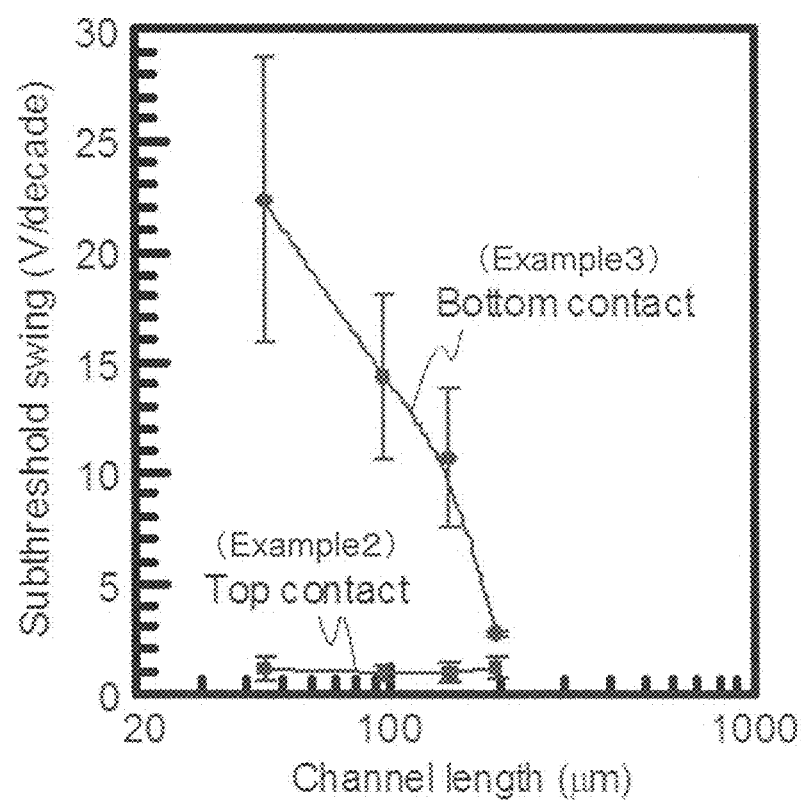
FIG. 22 A graph that shows the channel length dependence of the subthreshold swing of transistors fabricated in Examples 2 and 3.
Figure 23:
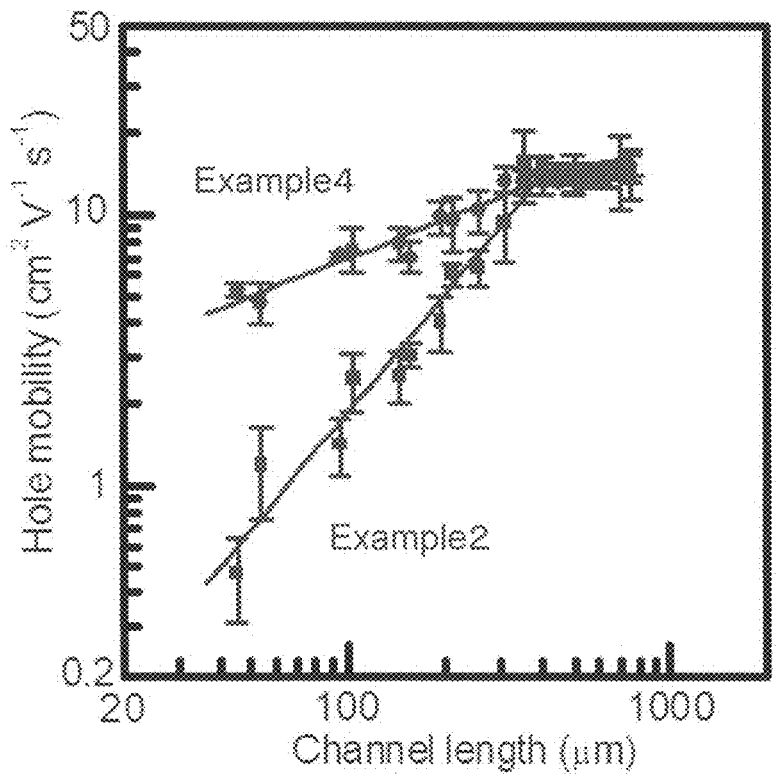
FIG. 23 A graph that shows the channel length dependence of the hole mobility of the transistors fabricated in Examples 2 and 4.
Figure 24:
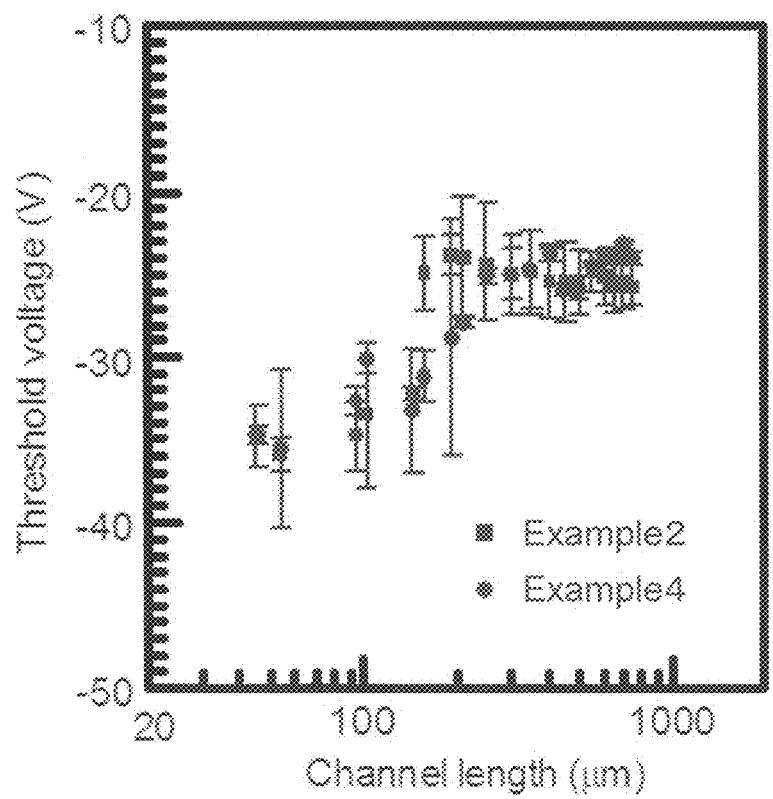
FIG. 24 A graph that shows the channel length dependence of the threshold voltage of the transistors fabricated in Examples 2 and 4.
Figure 25:
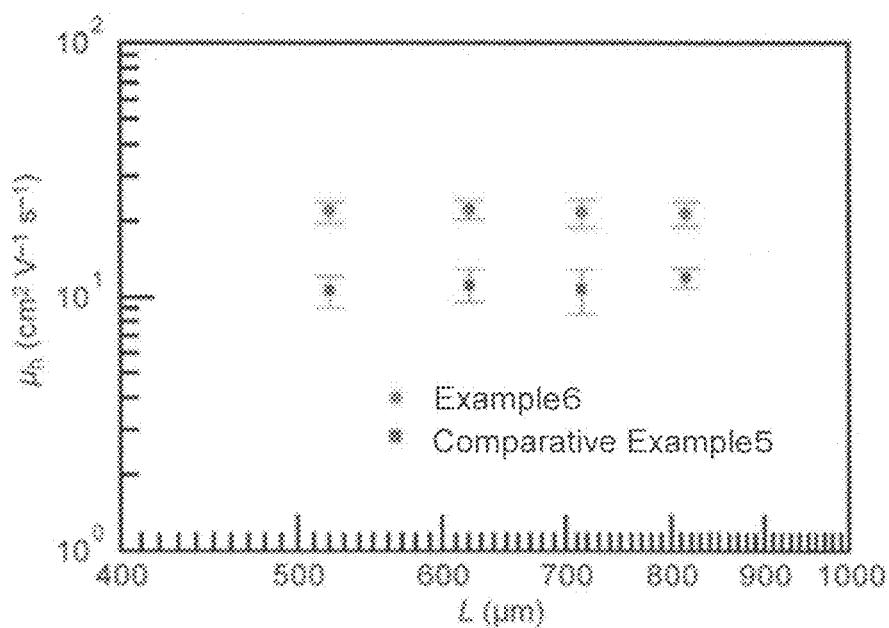
FIG. 25 A graph that shows the channel length dependence of the hole mobility $\mu_h$ of the transistors fabricated in Example 6 and Comparative Example 5.
Figure 26:
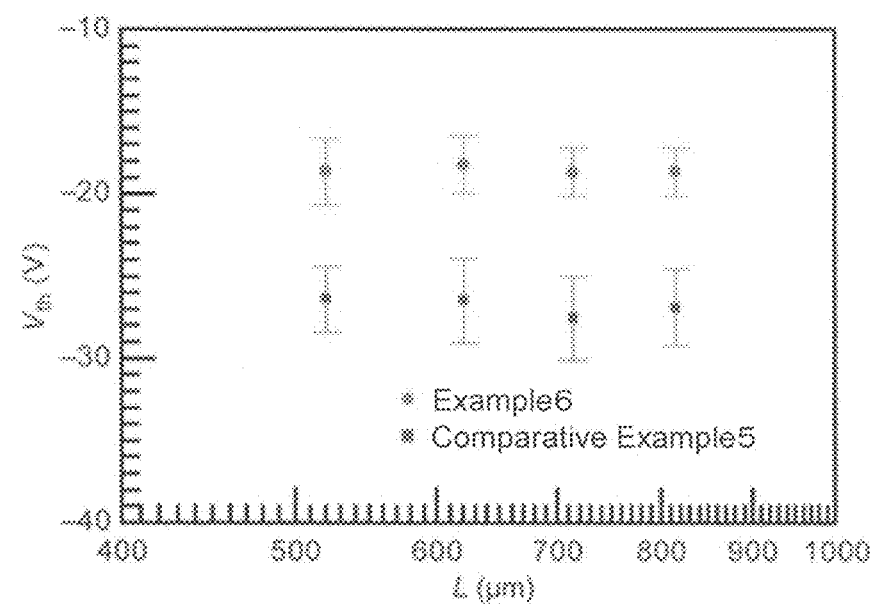
FIG. 26 A graph that shows the channel length dependence of the threshold voltage $V_{th}$ of the transistors fabricated in Example 6 and Comparative Example 5.
Figure 27:
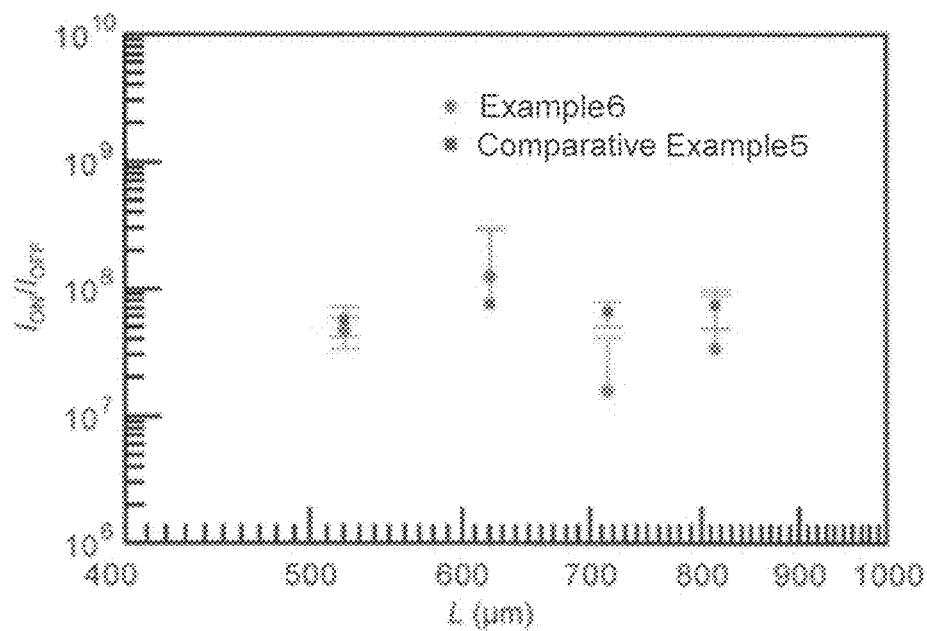
FIG. 27 A graph that shows the channel length dependence of the current on/off ratio $I_{on}/I_{off}$ of the transistors fabricated in Example 6 and Comparative Example 5.
Figure 28:
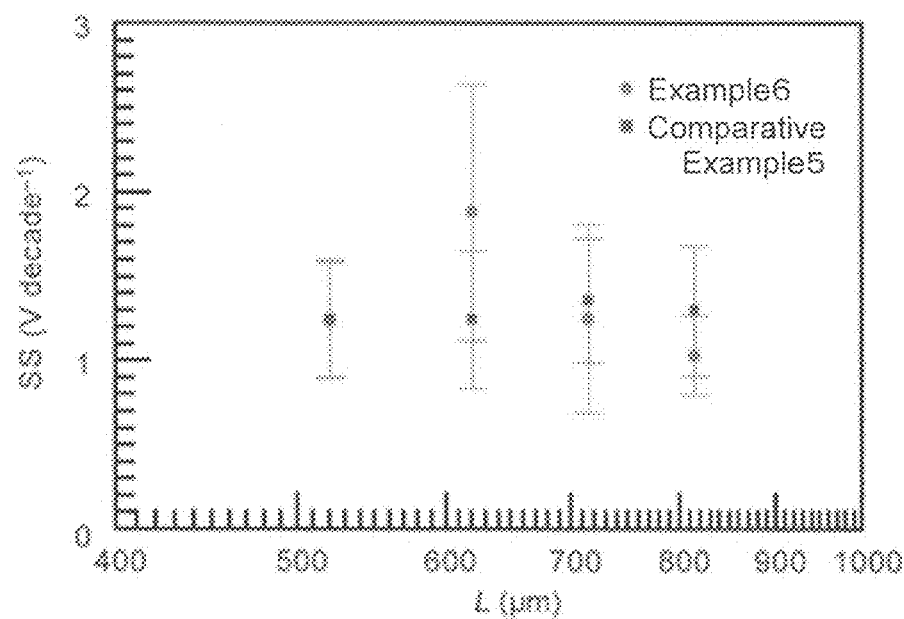
FIG. 28 A graph that shows the channel length dependence of the subthreshold swing (SS) of the transistors fabricated in Example 6 and Comparative Example 5.
Figure 29:
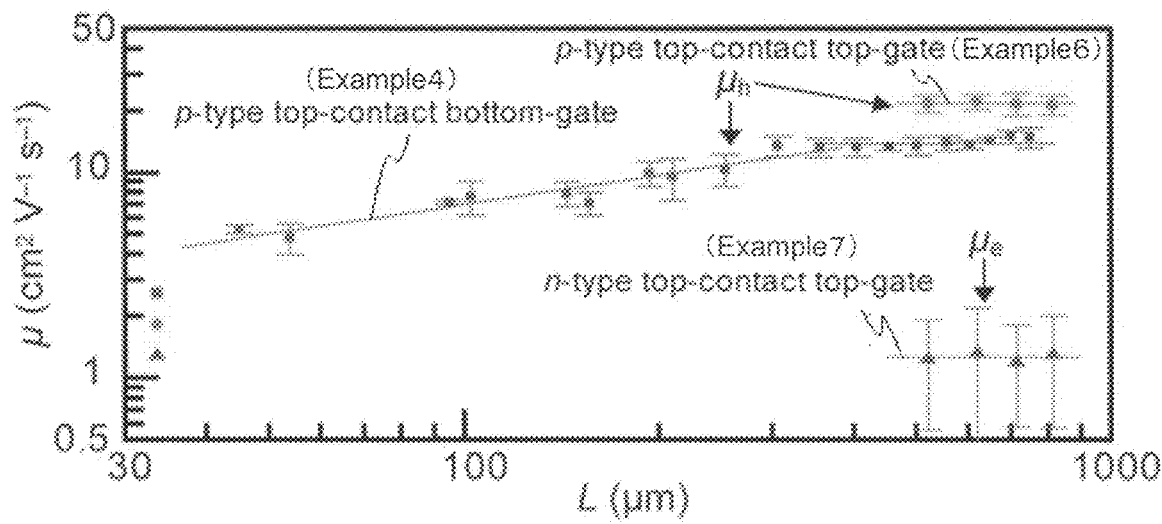
FIG. 29 A graph that shows the channel length dependence of the carrier mobility $\mu$ of transistors fabricated in the Examples 4, 6, and 7.
Figure 30:
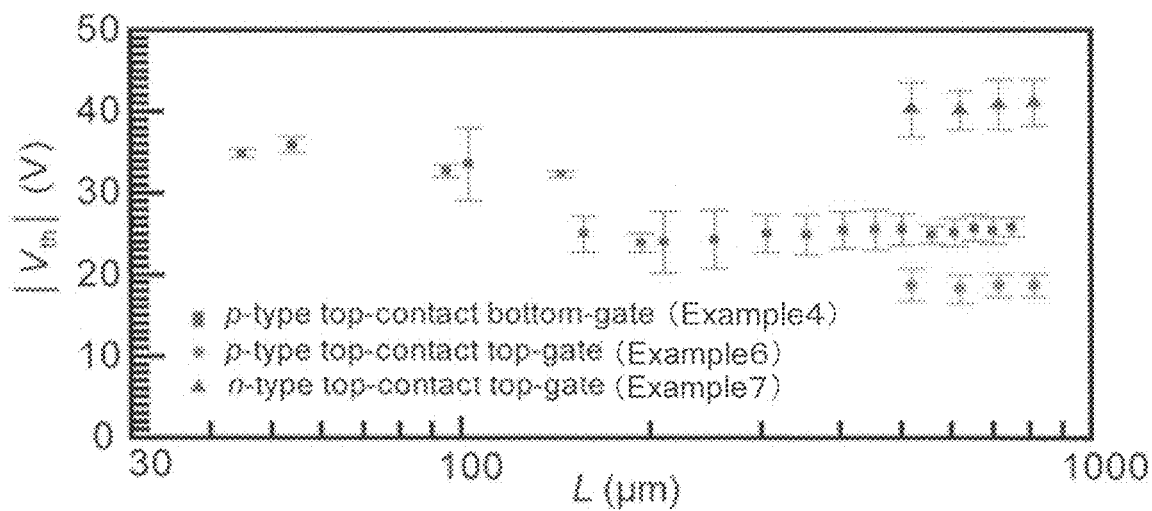
FIG. 30 A graph that shows the channel length dependence of the absolute value $|V_{th}|$ of the threshold voltage of the transistors fabricated in Examples 4, 6, and 7.
Figure 31:
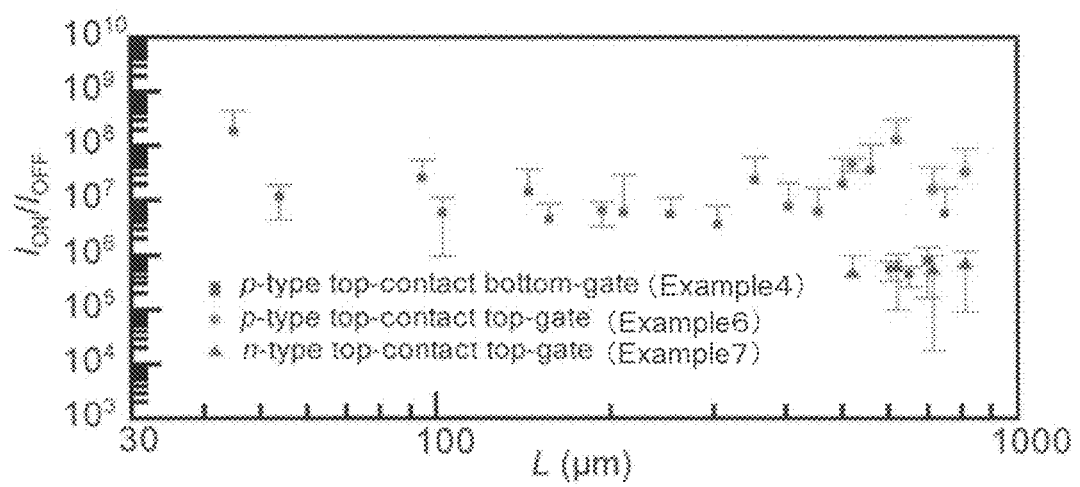
FIG. 31 A graph that shows the channel length dependence of the current on/off ratio $I_{on}/I_{off}$ of the transistors fabricated in Examples 4, 6, and 7.
Figure 32:
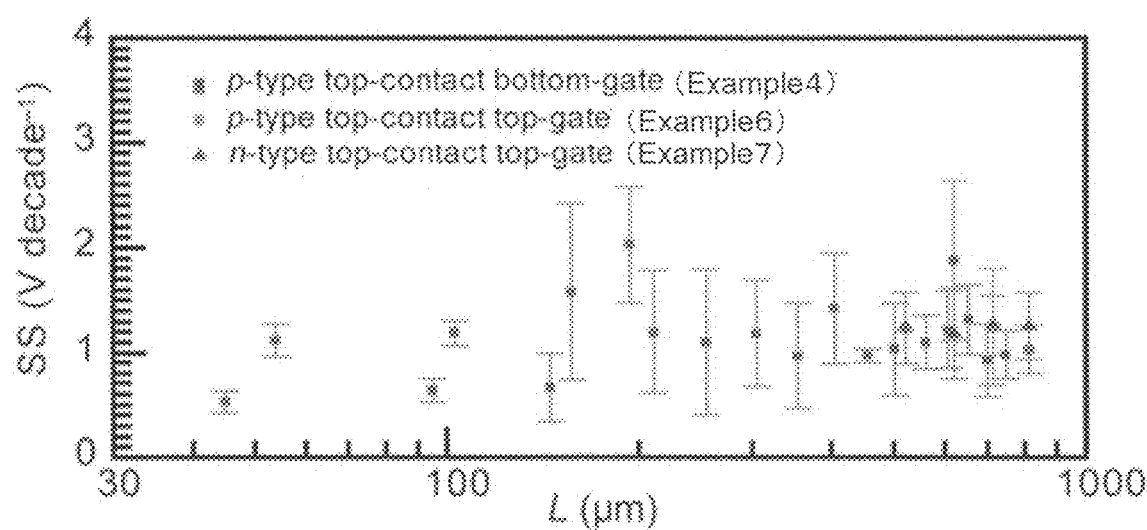
FIG. 32 A graph that shows the channel length dependence of the subthreshold swing (SS) of the transistors fabricated in Examples 4, 6, and 7.
Figure 33:
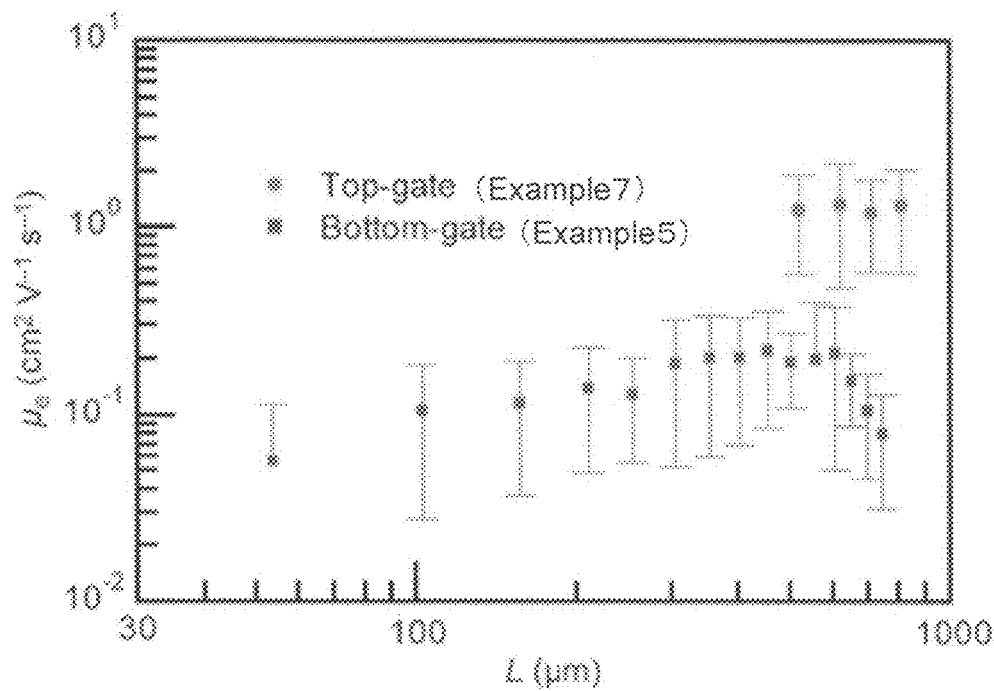
FIG. 33 A graph that shows the channel length dependence of the electron mobility $\mu_e$ of the transistors fabricated in Examples 5 and 7.
Figure 34:
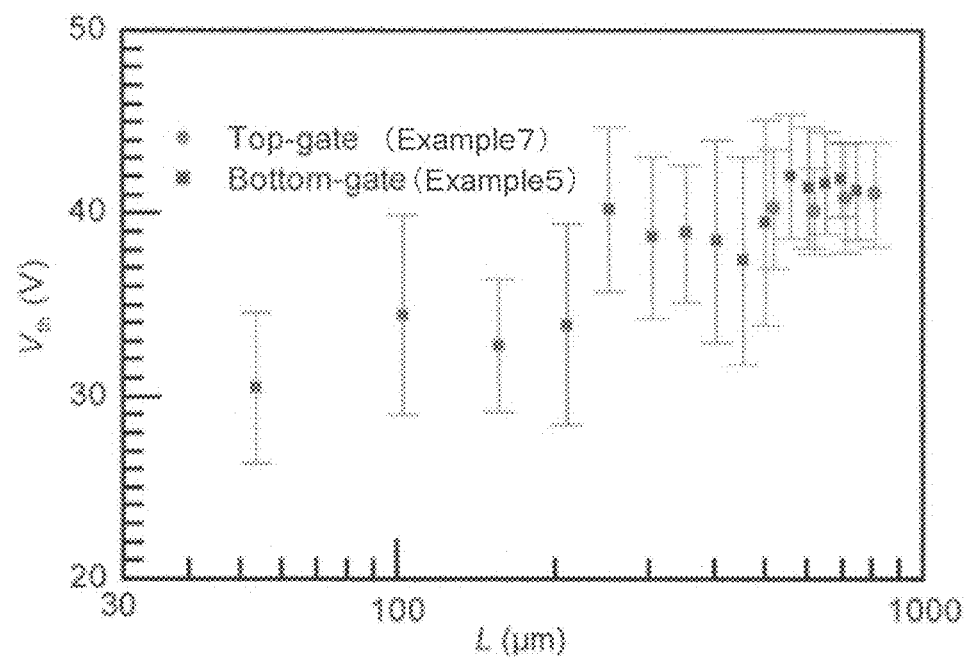
FIG. 34 A graph that shows the channel length dependence of the threshold voltage $V_{th}$ of the transistors fabricated in Examples 5 and 7.
Figure 35:
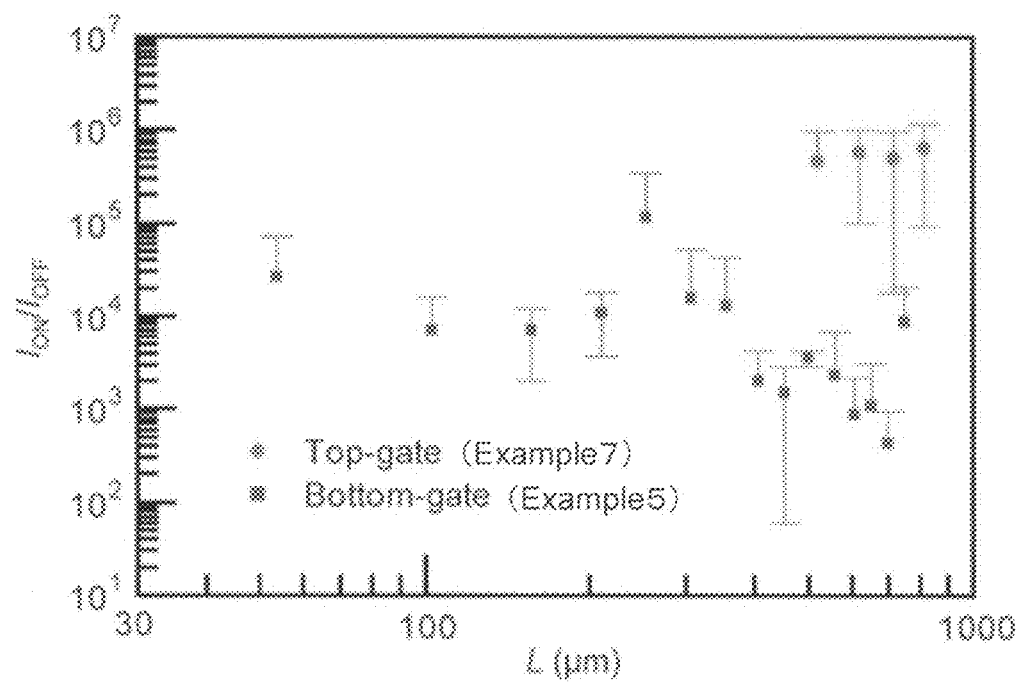
FIG. 35 A graph that shows the channel length dependence of the current on/off ratio $I_{on}/I_{off}$ of the transistors fabricated in Examples 5 and 7.
Figure 36:
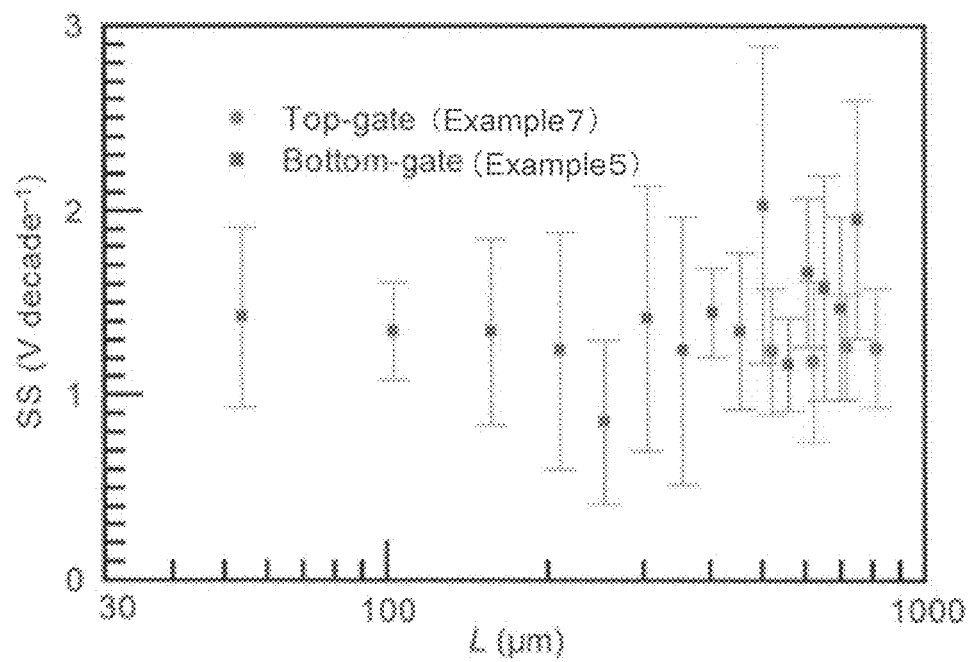
FIG. 36 A graph that shows the channel length dependence of the subthreshold swing (SS) of the transistors fabricated in Examples 5 and 7.

In the transistors thus fabricated in Examples 2 and 3 and Comparative Examples 3 and 4, the drain current-source-drain voltage characteristics were determined as shown in (a) of FIG. 14 to (a) of FIG. 18, and the drain current-gate voltage characteristics were determined as shown in (b) of FIG. 14 to (b) of FIG. 18. FIGS. 14 to 16 show both the characteristics when the voltage was decreased from 0 and the characteristics when the voltage was operated in the reverse direction. The characteristics of the transistors calculated from these measurement results are summarized in Table 1. In Table 1, "Forward" indicates that the voltage was decreased from 0, and "Reverse" indicates that the voltage was operated in the direction reverse to that of "Forward". Also, for the transistors with different channel lengths L in Examples 2 and 3, the channel length dependence of the hole mobility was determined as shown in FIG. 19, the channel length dependence of the threshold voltage was determined as shown in FIG. 20, the channel length dependence of the current on/off ratio was determined as shown in FIG. 21, and the channel length dependence of the subthreshold swing was determined as shown in FIG. 22. Also, for the transistors with different channel lengths in Examples 2 and 4, the channel length dependence of the hole mobility was determined as shown in FIG. 23, and the channel length dependence of the threshold voltage was determined as shown in FIG. 24. For the transistors with different channel lengths L in Example 6 and Comparative Example 5, the channel length dependence of the hole mobility $\mu_h$ was determined as shown in FIG. 25, the channel length dependence of the threshold voltage V$_{th}$ was determined as shown in FIG. 26, the channel length dependence of the current on/off ratio I$_{on}$/I$_{off}$ was determined as shown in FIG. 27, and the channel length dependence of the subthreshold swing (SS) was determined as shown in FIG. 28. For the transistors with different channel lengths L in Example 4, 6, and 7, the channel length dependence of the carrier mobility $\mu$ was determined as shown in FIG. 29, the channel length dependence of the absolute value |V$_{th}$| of the threshold voltage was determined as shown in FIG. 30, the channel length dependence of the current on/off ratio I$_{on}$/I$_{off}$ was determined as shown in FIG. 31, and the channel length dependence of the subthreshold swing (SS) was determined as shown in FIG. 32. For the transistors with different channel lengths L in Examples 5 and 7, the channel length dependence of the electron mobility $\mu_e$ was determined as shown in FIG. 33, the channel length dependence of the threshold voltage V$_{th}$ was determined as shown in FIG. 34, the channel length dependence of the current on/off ratio I$_{on}$/I$_{off}$ was determined as shown in FIG. 35, and the channel length dependence of the subthreshold swing (SS) was determined as shown in FIG. 36. In these measurement results, the measurement results for Example 7 in FIGS. 29 to 32, and FIGS. 33 to 36, reflect the behavior of each transistor as an n-type transistor, and other measurement results reflect the behavior of each transistor as a P-type transistor.

TABLE 1

| | Bias direction | Hole mobility $\mu_h$ (cm$^2$V$^{-1}$s$^{-1}$) | Threshold voltage $V_{th}$ (V) | Current on/off ratio $I_{on}/I_{off}$ | Subthreshold swing SS (V/decade) | Threshold voltage difference $\Delta V$ (V) |
|---|---|---|---|---|---|---|
| Example 2 | Forward | 12 | −17 ± 5.1 | (3.2 ± 8.7) × 10$^7$ | 1.2 ± 0.4 | 3.8 ± 1.7 |
| | Reverse | 13 | −21 ± 3.9 | (4.5 ± 4.2) × 10$^5$ | 2.6 ± 0.5 | |
| Comparative Example 3 | Forward | 3.0 ± 1.6 | −28 ± 4.6 | (3.0 ± 5.1) × 10$^7$ | 1.7 ± 0.9 | 7.7 ± 4.3 |
| | Reverse | 7.9 ± 2.9 | −35 ± 5.3 | (1.5 ± 8.1) × 10$^5$ | 3.8 ± 1.1 | |
| Comparative Example 4 | Forward | 3.6 ± 0.1 | −31 ± 3.9 | (1.5 ± 2.1) × 10$^6$ | 1.2 ± 0.4 | 7.5 ± 3.5 |
| | Reverse | 8.4 ± 2.7 | −37 ± 2.7 | (8.6 ± 6.9) × 10$^4$ | 3.6 ± 0.7 | |

By comparing FIGS. 14 to 16, with regard to both drain current-source-drain voltage characteristics and drain current-gate voltage characteristics, the hysteresis was suppressed and thus good characteristics were obtained in the transistor in Example 2, which had NH$_3$I groups disposed on the support surface, compared to the transistors in Comparative Examples 3 and 4. Also, as shown in TABLE 1, the transistor in Example 2 had a hole mobility of 12 cm$^2$/Vs in the Forward direction, which was by far higher than the hole mobility of the transistors in Comparative Examples 3 and 4 (3.0 cm$^2$/Vs and 3.6 cm$^2$/Vs). The transistor in Example 2 also had a lower threshold voltage than the transistors in Comparative Examples 3 and 4.

Figure 17:
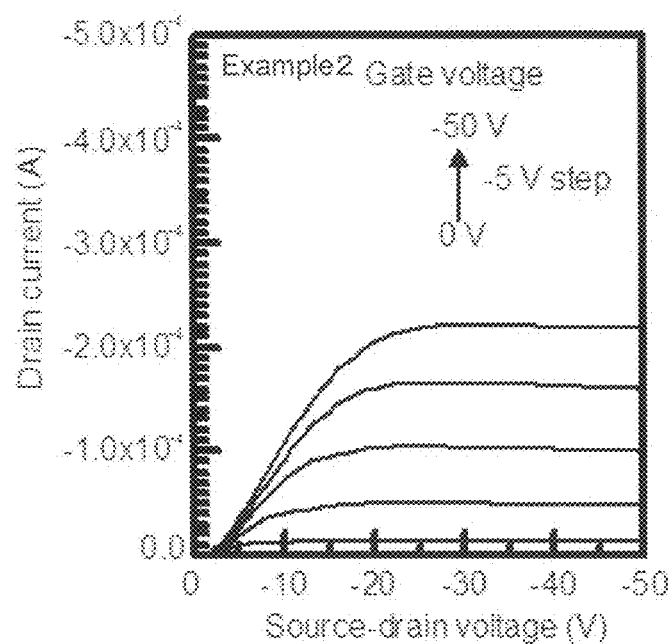
FIG. 17 Graphs that show the input/output characteristics of the transistor fabricated in Example 2. (a) A graph that shows the drain current-source-drain voltage characteristics. (b) A graph that shows the drain current-gate voltage characteristics.
Figure 17:
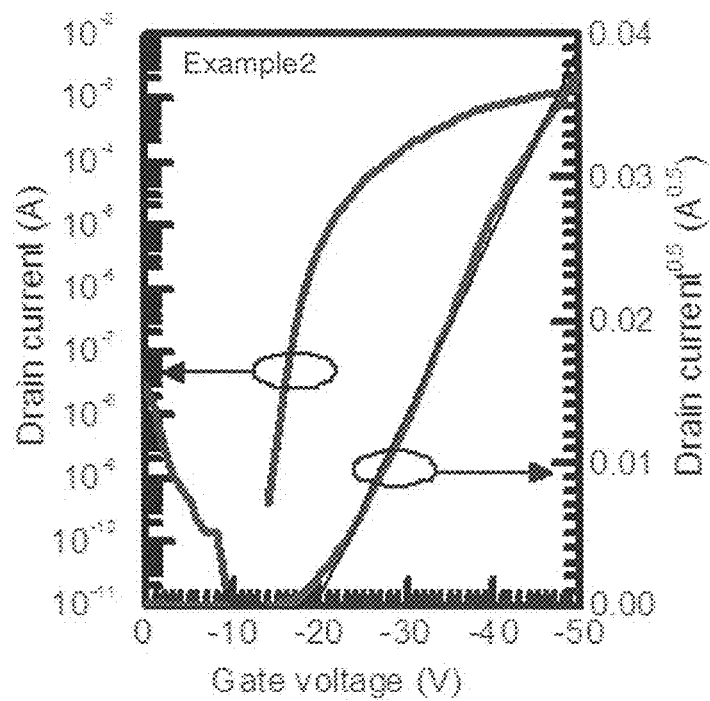

Also, by comparing FIGS. 17 and 18, it can be seen that the top-contact transistor in Example 2 has better characteristics than the bottom-contact transistor in Example 3. Also, as shown in FIGS. 19, 21, and 22, the top-contact transistor in Example 2 was superior to the bottom-contact transistor in Example 3 in terms of hole mobility, current on/off ratio, and subthreshold swing characteristics.

In FIG. 23, the transistor in Example 4, which includes a MoOx layer between the source/drain electrodes and the two-dimensional perovskite layer, and the transistor in Example 2, which has no MoOx layer, are compared for their channel length dependence. The transistor with the MoOx layer shows a smaller change in the hole mobility dependent on the channel length (a less steep slope) and a greater maximum value of the hole mobility than the transistor without the MoOx layer. Presumably, this effect of the MoOx layer will be due to a reduction in the contact resistance between the two-dimensional perovskite layer and the source electrode/drain electrode as a result of the formation of the MoOx layer.

Also, when the channel length exceeds 300 μm, the hole mobility converges and the curve reaches a plateau in both the system with the MoOx layer and the system without the MoOx layer. Presumably, this is because a sufficiently large channel length can suppress the effect of the contact resistance to a negligible level. When the curve has reached a plateau, the mobility can be interpreted as the essential mobility of the two-dimensional perovskite layer. FIG. 23 shows that the hole mobility (maximum hole mobility) is 17 cm$^2$/Vs when the curve has reached a plateau, confirming that a two-dimensional perovskite layer formed on a surface with NH$_3$I groups disposed thereon can provide a very high hole mobility.

Additional transistors were also fabricated in the same manner as in Example 2 except using different thicknesses of the two-dimensional perovskite layer, and investigated for their characteristics. As a result, the two-dimensional perovskite layer provided a good mobility and a good threshold voltage when its thickness was in a range from 30 to 50 nm. It was also suggested that a good mobility and a good threshold voltage might be achieved with a smaller thickness by modifying the method to form the two-dimensional perovskite layer.

FIGS. 25 to 28 compare the characteristics of top-contact/top-gate transistors with NH$_3$I groups disposed on the support surface (Example 6) and without them (Comparative Example 5). As seen from FIGS. 25 and 26, the transistor in Example 6 has an improved hole mobility and an improved threshold voltage compared to the transistor in Comparative Example 5. This demonstrates the effect of forming the two-dimensional perovskite layer on a surface with NH$_3$I groups disposed thereon also obtained in a top-contact/top-gate transistor.

In FIGS. 29 to 32, in transistors with NH$_3$I groups disposed on a support surface, a top-contact/bottom-gate one (Example 4) and a top-contact/top-gate one (Example 6) were compared for their characteristics. A top-contact/top-gate transistor (Example 7) was also assessed for its n-type transistor characteristics. In FIGS. 33 to 36, in transistors with NH$_3$I groups disposed on a support surface, a top-contact/bottom-gate one (Example 5) and a top-contact/top-gate one (Example 7) were compared for their n-type transistor characteristics. As seen from FIG. 29, a top-contact/top-gate transistor (Example 6) had a higher hole mobility than a top-contact/bottom-gate transistor (Example 4), achieving very high hole mobility of up to 26 cm$^2$/Vs. Presumably, this is because, in a top-contact/top-gate transistor which includes an insulator layer on the surface of the two-dimensional perovskite layer on the opposite side to the substrate, there is a good contact between the two-dimensional perovskite layer and the insulator layer, in light of the observation that, when a two-dimensional perovskite layer is formed on a surface with NH$_3$I groups disposed thereon, the density of defects is particularly reduced around the surface of the two-dimensional perovskite layer (on the opposite side to the substrate) (see the description of FIG. 11).

On the other hand, measurement results from Example 7 in FIG. 29 demonstrated an electron mobility of up to 1.7 cm$^2$/Vs. Although this electron mobility was lower than the hole mobility obtained in Example 6, the n-type transistor behavior achieved in the transistor that employed a two-dimensional perovskite layer as its semiconductor layer was very epoch-making. From FIGS. 33 to 36, a top-contact/bottom-gate transistor (Example 5) also demonstrated an n-type transistor behavior, but the top-contact/top-gate transistor (Example 7) had a higher electron mobility and thus proved to be a superior n-type transistor.

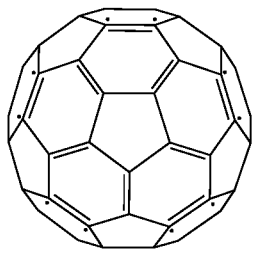

C$_{60}$

INDUSTRIAL APPLICABILITY

The two-dimensional perovskite forming material of the present invention can realize a high carrier mobility in a two-dimensional perovskite layer, making it possible to use the two-dimensional perovskite layer as an effective semiconductor material in elements such as transistor. Also, such a two-dimensional perovskite layer can be both flexibilized and formed by solution deposition, and thus can provide a flexible element at a lower cost when it is employed as the semiconductor material of the element. Therefore, the present invention has a high industrial applicability.

| Reference Numerals and Signs |
| --- |
| 1 Ammonium halide group |
| 2 Inorganic framework |
| 3 Organic cation |
| 4 and 15 Stacked structure |
| 5 and 12 Support |
| 6 and 14 Gate electrode |
| 7 and 13 Insulator |
| 8 Monolayer |
| 9 Two-dimensional perovskite layer |
| 10 Source electrode |
| 11 Drain electrode |

The invention claimed is:

1. A substrate having a surface with ammonium halide groups disposed thereon in an ordered fashion corresponding to corners of a cubic crystal system of a perovksite.

2. The substrate according to claim 1, wherein the ammonium halide group is represented by —NH$_3$X and X represents a halogen ion.

3. The substrate according to claim 2, wherein X in the ammonium halide group is an iodide ion.

4. The substrate according to claim 1, which comprises a monolayer that has an ammonium halide group, wherein the ammonium halide group disposed on the surface is the ammonium halide group in the monolayer.

5. The substrate according to claim 1, wherein the ammonium halide group disposed on the surface is a terminal group in a molecular structure.

6. The substrate according to claim 5, wherein the molecular structure has a structure in which one terminal is the ammonium halide group, and the other terminal is a different functional group, and the ammonium halide group and the different functional group are joined by a linker.

7. The substrate according to claim 6, wherein the linking chain length of the linker is 2 to 10 atoms.

8. The substrate according to claim 6, wherein the linker joining the ammonium halide group and the different functional group is an alkylene group, an alkyleneoxy group, an arylene group, an aryleneoxy group, an alkenylene group, or an alkynylene group, or a linker formed by joining two or more selected from these groups.

9. The substrate according to claim 6, wherein the linker has a linear molecular structure.

10. The substrate according to claim 6, wherein the different functional group in the molecular structure is: a hydroxyl group, a thiol group, a carboxyl group, an alkoxysilyl group, or a halosilyl group, or a linker formed by a reaction between one of these groups and another functional group in a different molecular structure than the molecular structure.

11. The substrate according to claim 10, wherein the functional group is a hydroxyl group or a carboxyl group.

12. The substrate according to claim 10, wherein the functional group is an oxy group (—O—) formed by a reaction between hydroxyl groups.

13. The substrate according to claim 10, wherein the functional group is an ester group (—COO—) formed by a reaction between a hydroxyl group and a carboxyl group.

14. The substrate according to claim 5, wherein the molecular structure is a molecular structure represented by the general formula (1) below:

$$(\text{—O—})_3\text{Si}(\text{CH}_2)_n\text{NH}_3\text{I} \quad (1)$$

wherein n is an integer from 1 to 20.

15. A supported substrate comprising the substrate of claim 5 and a support, wherein the support has a functional group on the surface of the support on the side toward the molecular structure.

16. The supported substrate according to claim 15, wherein the molecular structure is joined to the support.

17. The supported substrate according to claim 5, wherein the support has a stacked structure of a gate electrode and an insulator, and has the molecular structure on the insulator on an opposite side to the gate electrode.

18. The supported substrate according to claim 17, wherein the gate electrode is formed from silicon (Si) as its major constituent, and the insulator is formed from silicon dioxide (SiO$_2$) as its major constituent.

19. The supported substrate according to claim 15, wherein the support is a source electrode or a drain electrode.

20. A stacked structure, comprising a layer with an ammonium halide group disposed on its surface and a two-dimensional perovskite layer, wherein the layer with an ammonium halide group disposed on its surface is formed from a substrate having a surface with an ammonium halide group disposed thereon.

21. The stacked structure according to claim 20, wherein the two-dimensional perovskite layer comprises Sn or Pb.

22. The stacked structure according to claim 20, wherein the two-dimensional perovskite layer comprises an alkylene group-containing compound.

23. The stacked structure according to claim 20, wherein the two-dimensional perovskite layer comprises an aromatic ring-containing compound.

24. The stacked structure according to claim 20, wherein the two-dimensional perovskite layer comprises a compound that has an alkylene group joined to an aromatic ring in its structure.

25. The stacked structure according to claim 20, wherein the two-dimensional perovskite layer comprises a perovskite-type compound represented by any one of the general formulas (2) to (4) below:

$$A_2BX_4 \quad (2)$$

wherein A represents an organic cation, B represents a divalent metal ion, and X represents a halogen ion, and the two instances of A, or the four instances of X, may be the same as each other or not, $$A^2{}_2A^1{}_{n-1}B_nX_{3n+1} \quad (3)$$

wherein $A^1$ represents an organic cation, $A^2$ represents an organic cation with a carbon number greater than that of $A^1$, B represents a divalent metal ion, X represents a halogen ion, n represents an integer from 1 to 100, the two instances of $A^2$, or the plural instances of X, may be the same as each other or not, and when n is 3 or more, the plural instances of $A^1$ may be the same as each other or not, $$A^2{}_2A^1{}_mB_mX_{3m+2} \quad (4)$$

wherein $A^1$ represents an organic cation, $A^2$ represents an organic cation with a carbon number greater than that of $A^1$, B represents a divalent metal ion, X represents a halogen ion, m represents an integer from 1 to 100, the two instances of $A^2$, or the plural instances of X, may be the same as each other or not, and when m is 2 or more, the plural instances of $A^1$ may be the same as each other or not.

26. The stacked structure according to claim 25, wherein A in the general formula (2) is an ammonium represented by the general formula (5) below, $A^1$ in the general formula (3) is an ammonium represented by the general formula (6) below, $A^2$ in the general formula (3) is an ammonium represented by the general formula (5) below, $A^1$ in the general formula (4) is an ammonium represented by the general formula (6) below, and $A^2$ in the general formula (4) is an ammonium represented by the general formula (7) below:

$$R_4N^+ \quad (5)$$

wherein R represents a hydrogen atom or a substituent, and at least one of the four instances of R is a substituent with a carbon number of 2 or more, $$R^{11}{}_4N^+ \quad (6)$$

wherein $R^{11}$ represents a hydrogen atom or a substituent, and at least one of the four instances of R is a substituent, $$(R^{12}{}_2C=NR^{13}{}_2)^+ \quad (7)$$

wherein $R^{12}$ and $R^{13}$ each independently represent a hydrogen atom or a substituent.

27. The stacked structure according to claim 26, wherein the ammonium represented by the general formula (5) is an ammonium represented by the general formula (5a) below:

$$Ar(CH_2)_{n1}NH_3^+ \quad (5a)$$

wherein Ar represents an aromatic ring, and n1 is an integer from 1 to 20.

28. The stacked structure according to claim 27, wherein Ar in the general formula (5a) is a benzene ring, or a fused polycyclic hydrocarbon that has a structure with more than one benzene ring fused.

29. The stacked structure according to claim 25, wherein B in the general formulas (2) to (4) is $Sn^{2+}$ or $Pb^{2+}$.

30. The stacked structure according to claim 25, wherein X in the general formulas (2) to (4) is an iodide ion.

31. The stacked structure according to claim 20, wherein the two-dimensional perovskite layer has a thickness of 50 nm or less.

32. A method to produce a two-dimensional perovskite, which forms a two-dimensional perovskite layer on a layer with an ammonium halide group disposed on its surface, wherein the layer with an ammonium halide group disposed on its surface is formed from a substrate having a surface with an ammonium halide group disposed thereon.

33. The method to produce a two-dimensional perovskite according to claim 32, wherein the layer with an ammonium halide group disposed on its surface is a layer formed by spin-coating a support with a compound that has an ammonium halide group.

34. The method to produce a two-dimensional perovskite according to claim 32, wherein the layer with an ammonium halide group disposed on its surface is a self-assembled monolayer formed using a molecule with a terminal ammonium halide group.

35. The method to produce a two-dimensional perovskite according to claim 32, wherein the layer with an ammonium halide group disposed on its surface is formed by: conducting a process to form a self-assembled monolayer that has an amino group and then convert the amino group to the ammonium halide.

36. The method to produce a two-dimensional perovskite according to claim 32, wherein the two-dimensional perovskite layer is formed by solution deposition.

37. An element comprising the stacked structure according to claim 20.

38. A transistor comprising the stacked structure according to claim 20.

39. The transistor according to claim 38, wherein the stacked structure has a stacked structure of a gate electrode and an insulator, and the ammonium halide group is disposed on the surface of the insulator on an opposite side to the gate electrode.

40. The transistor according to claim 38, which is a top-contact transistor.

41. The transistor according to claim 38, which is a top-contact/top-gate transistor.

42. The transistor according to claim 38, which has a transition metal oxide layer between the two-dimensional perovskite layer and at least one of the source electrode and the drain electrode.

43. The transistor according to claim 42, wherein the transition metal oxide layer is a molybdenum oxide layer, a rhenium oxide layer, or a tungsten oxide layer.

44. The transistor according to claim 43, wherein the metal oxide layer is a molybdenum oxide layer.

* * * * *